US010840155B2

United States Patent
Masuoka et al.

(10) Patent No.: US 10,840,155 B2
(45) Date of Patent: Nov. 17, 2020

(54) METHOD FOR PRODUCING PILLAR-SHAPED SEMICONDUCTOR DEVICE

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: UNISANTIS ELECTRONICS SINGAPORE PTE. LTD., Singapore (SG)

(*) Notice: Subject to any disclaimer, the term of this patent is extended or adjusted under 35 U.S.C. 154(b) by 33 days.

(21) Appl. No.: 16/380,068

(22) Filed: Apr. 10, 2019

(65) Prior Publication Data
US 2019/0295900 A1 Sep. 26, 2019

Related U.S. Application Data

(63) Continuation of application No. PCT/JP2016/080529, filed on Oct. 14, 2016.

(51) Int. Cl.
*H01L 21/82* (2006.01)
*H01L 21/8238* (2006.01)
(Continued)

(52) U.S. Cl.
CPC ........ *H01L 21/823885* (2013.01); *H01L 21/823437* (2013.01); *H01L 27/092* (2013.01);
(Continued)

(58) Field of Classification Search
CPC ........ H01L 21/823885; H01L 29/78; H01L 21/823437; H01L 29/42356;
(Continued)

(56) References Cited

U.S. PATENT DOCUMENTS 8,372,713 B2 * 2/2013 Masuoka ............ H01L 27/0207
257/329
8,847,298 B2 * 9/2014 Thomas ............... H01L 21/3065
257/306
(Continued)

FOREIGN PATENT DOCUMENTS

JP H02-188966 A 7/1990
JP 2009-081389 A 4/2009
(Continued)

OTHER PUBLICATIONS

Takato et al., "Impact of Surrounding Gate Transistor (SGT) for Ultra-High-Density LSI's" IEEE Transaction on Electron Devices, vol. 38, No. 3, pp. 573-578 (1991).
(Continued)

*Primary Examiner* — Charles D Garber
*Assistant Examiner* — S M Sohel Imtiaz
(74) *Attorney, Agent, or Firm* — Brinks Gilson & Lione

(57) ABSTRACT

Regions including $SiO_2$ layers, $Si_3N_4$ layers, and $SiO_2$ layers, and C layers and $SiO_2$ layers, whose two ends in Y-Y' direction are located on the $SiO_2$ layers and two ends in X-X' direction are coincident with the rectangular $SiO_2$ layers, are formed on an i-layer. The i-layer is etched using the $SiO_2$ layers as masks to form Si pillar bases, and the C layers and the $SiO_2$ layers are removed. Thereafter, the $SiO_2$ layers are formed into a circular shape by isotropic etching using the $Si_3N_4$ layers as masks, and Si pillars are formed on the Si pillar bases using the circular $SiO_2$ layers as masks.

13 Claims, 30 Drawing Sheets

(51) Int. Cl.
  *H01L 21/8234* (2006.01)
  *H01L 27/092* (2006.01)
  *H01L 27/11* (2006.01)
  *H01L 29/423* (2006.01)
  *H01L 29/78* (2006.01)

(52) U.S. Cl.
  CPC ........ *H01L 27/11* (2013.01); *H01L 29/42356* (2013.01); *H01L 29/78* (2013.01)

(58) Field of Classification Search
  CPC ........... H01L 29/66666; H01L 29/7827; H01L 21/823878
  See application file for complete search history.

(56) References Cited

U.S. PATENT DOCUMENTS

| | | | |
|---|---|---|---|
| 9,224,835 B2 | 12/2015 | Masuoka et al. | |
| 2012/0270374 A1* | 10/2012 | Masuoka | H01L 21/823885 438/268 |
| 2014/0239384 A1* | 8/2014 | Takaishi | H01L 29/42372 257/329 |
| 2015/0017767 A1* | 1/2015 | Masuoka | H01L 27/1116 438/211 |
| 2015/0221750 A1* | 8/2015 | Masuoka | H01L 21/823425 438/268 |

FOREIGN PATENT DOCUMENTS

| | | |
|---|---|---|
| JP | 5639318 B | 12/2014 |
| JP | 2016-157970 A | 9/2016 |

OTHER PUBLICATIONS

International Search Report and Written Opinion in International Application No. PCT/JP2016/080529, dated Dec. 27, 2016, 6 pages.
English translation of IPRP in International Application PCT/JP2016/080529, dated Apr. 25, 2019, 6 pages.

* cited by examiner

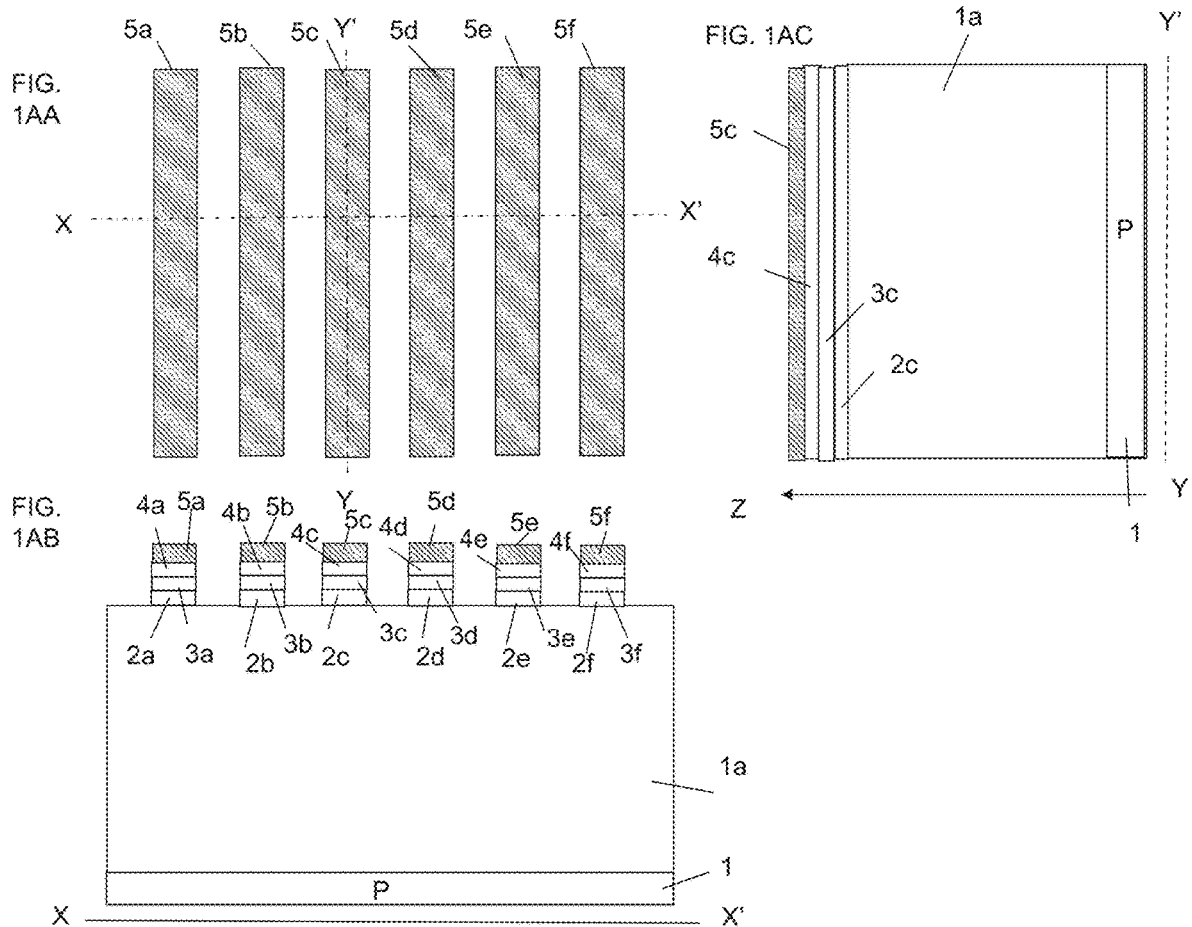

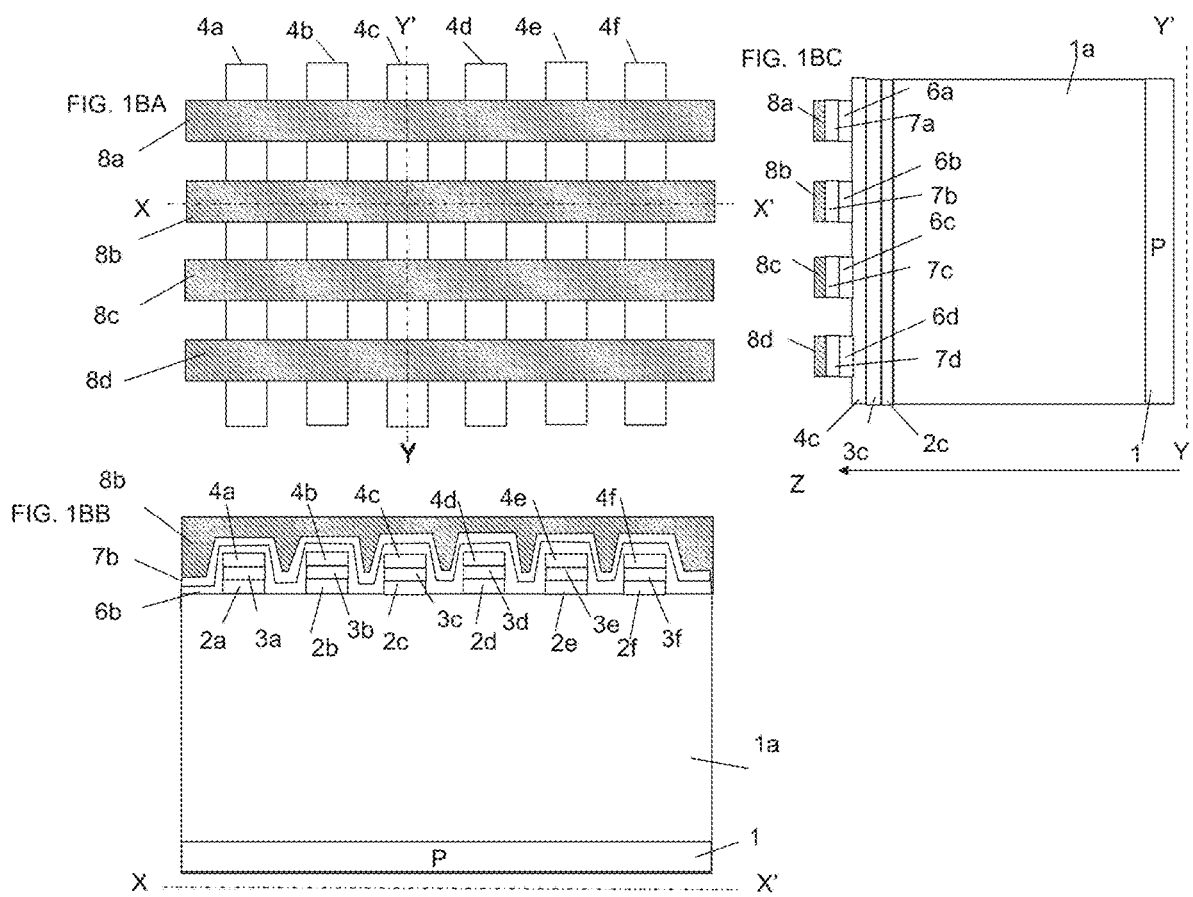

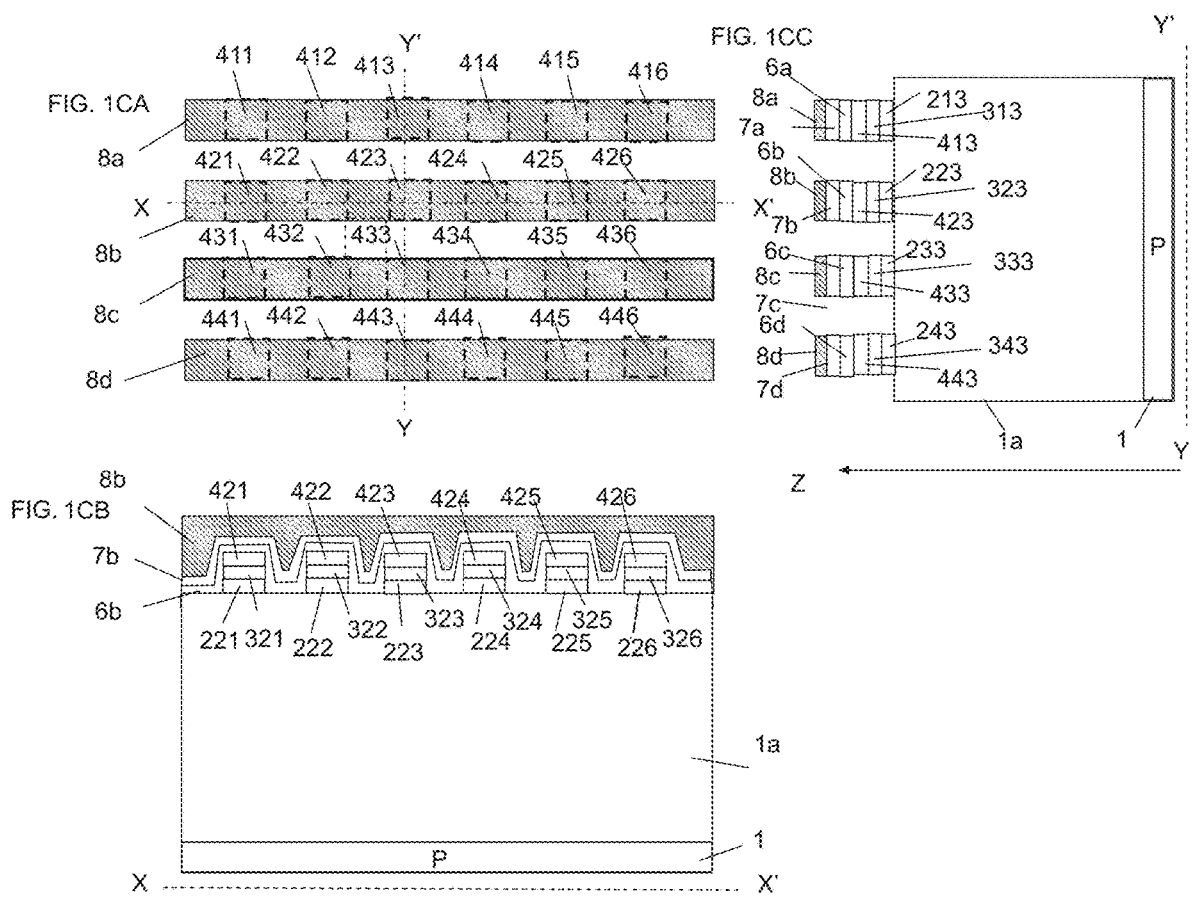

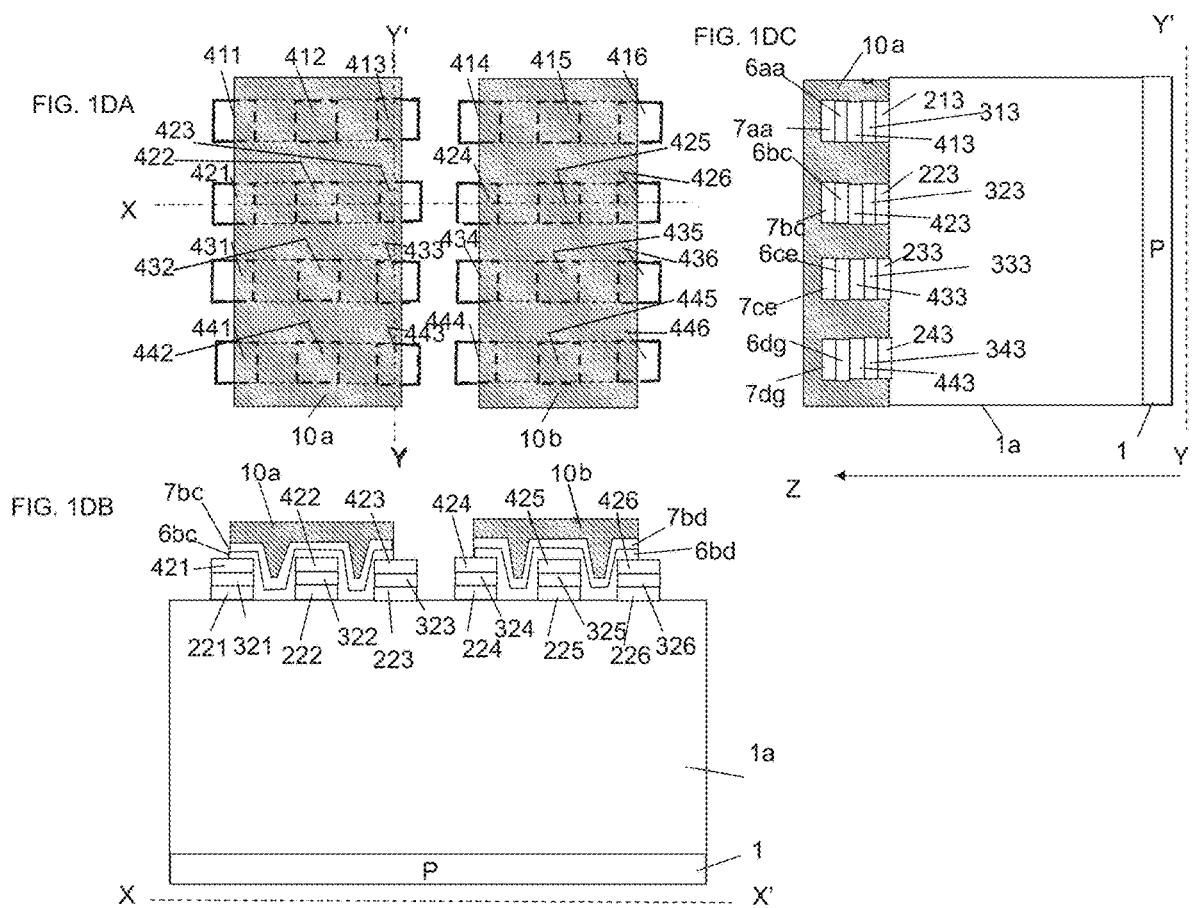

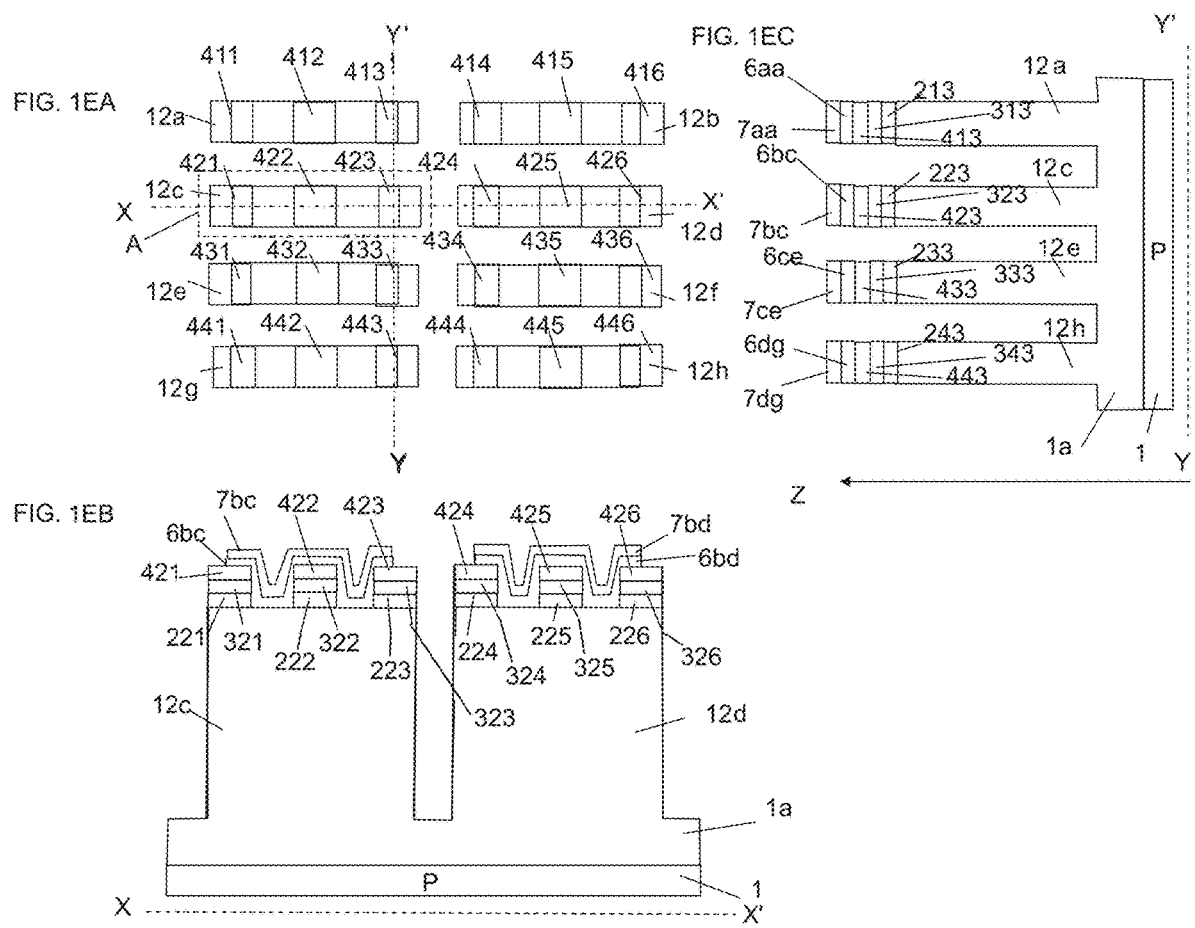

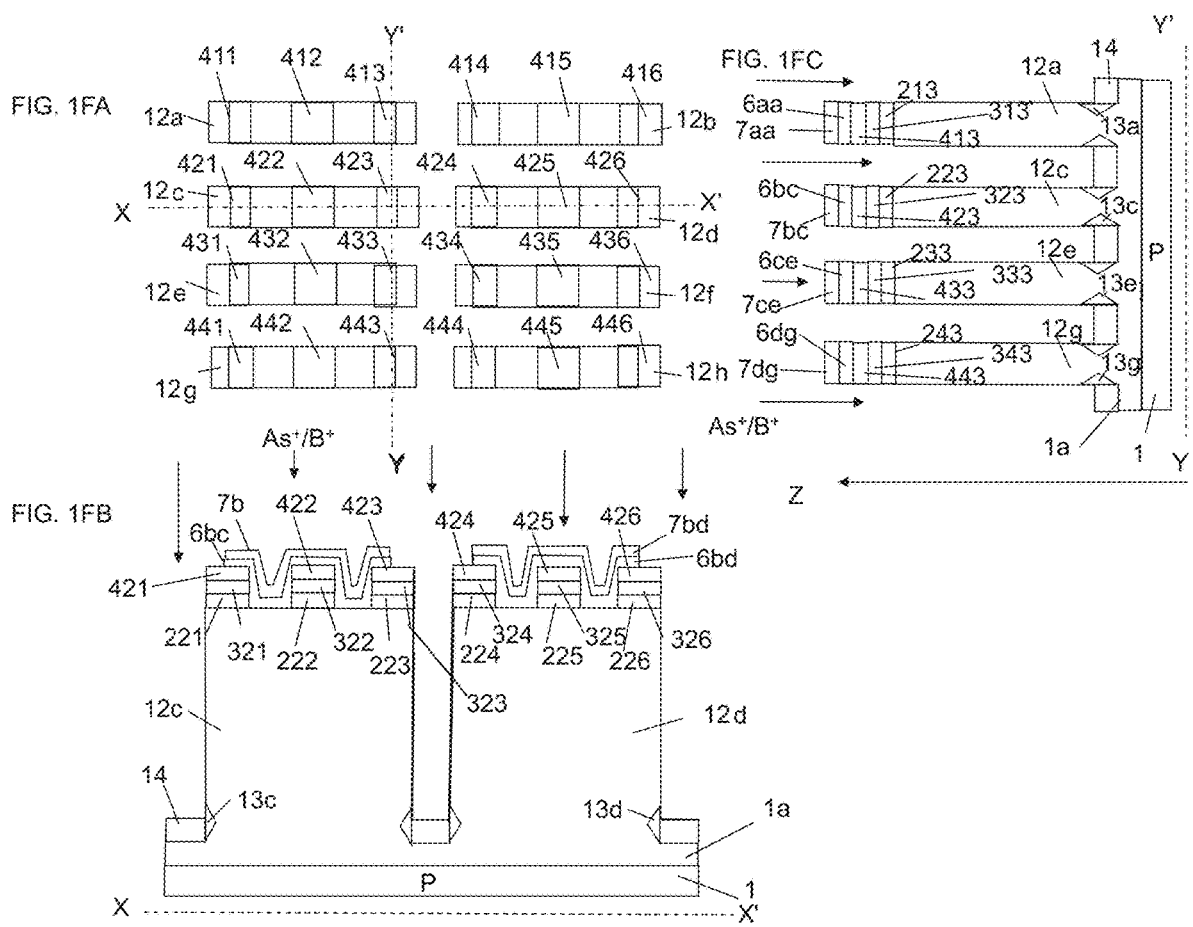

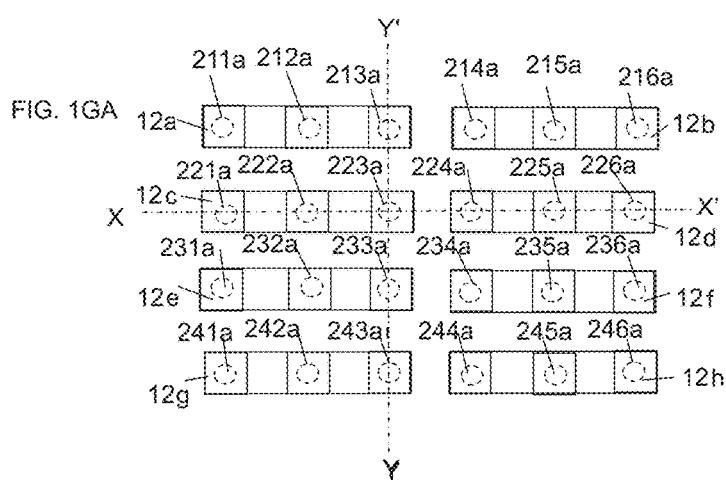
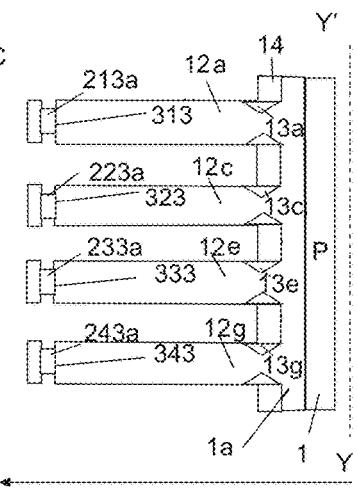
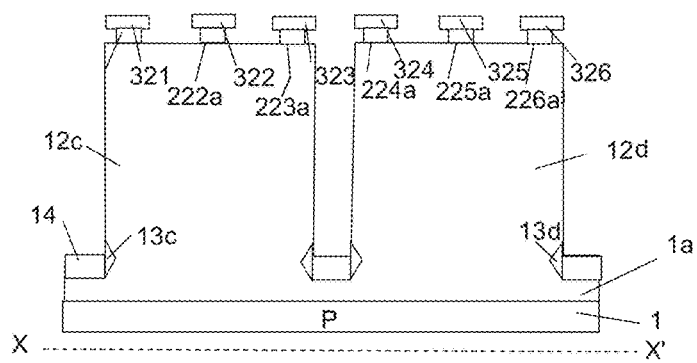
FIG. 1GA
FIG. 1GC
FIG. 1GB

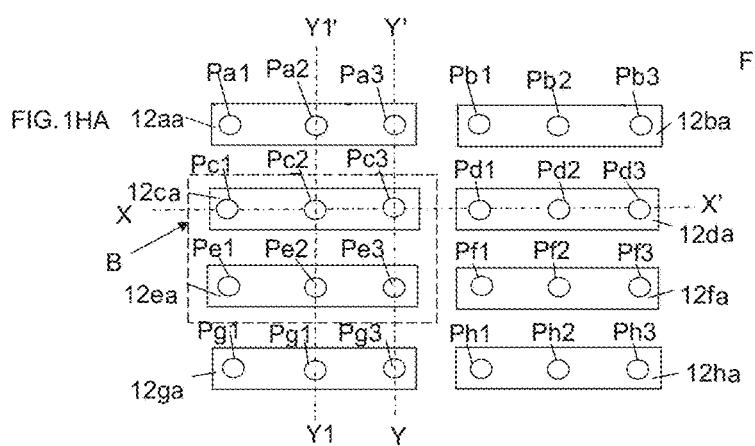
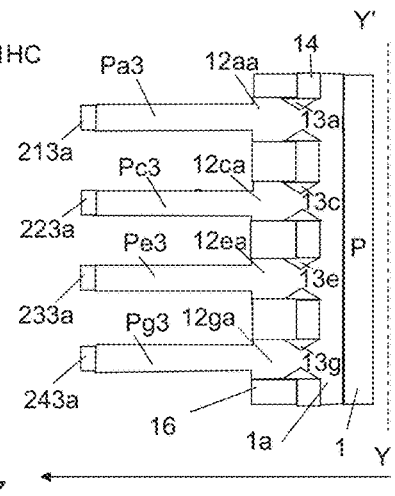
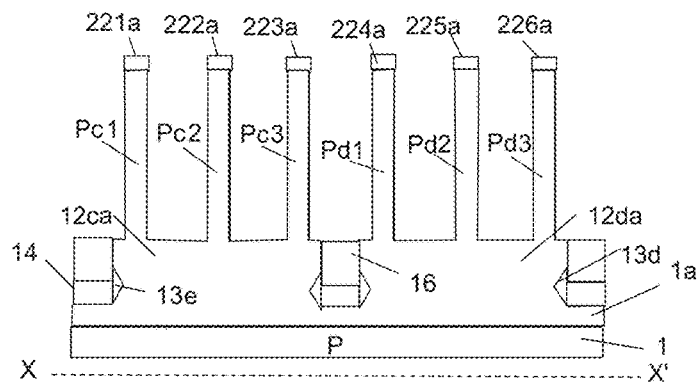

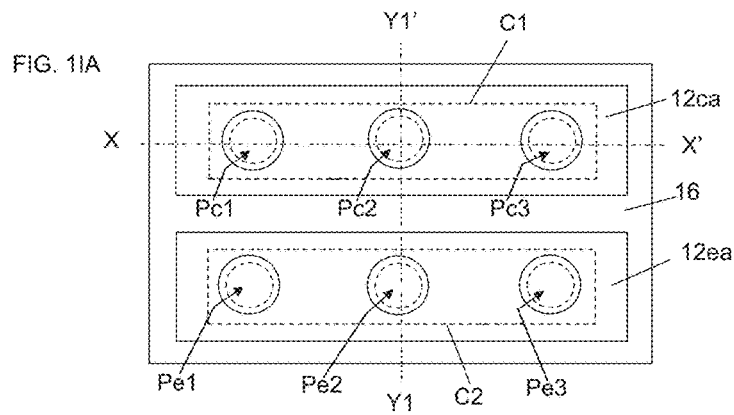
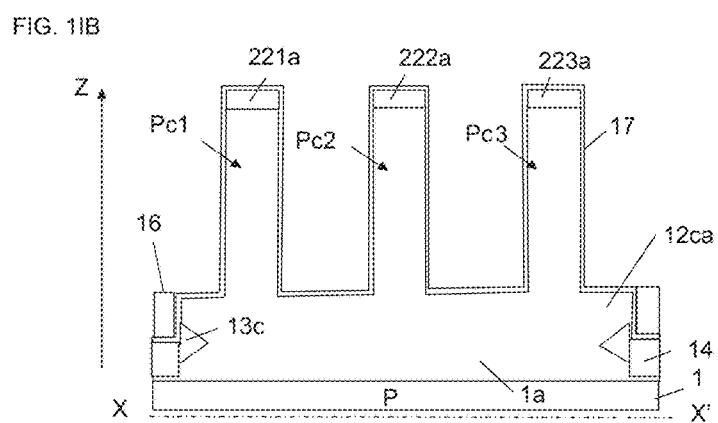
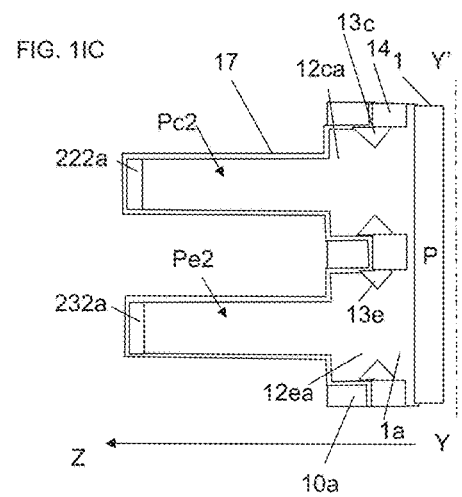

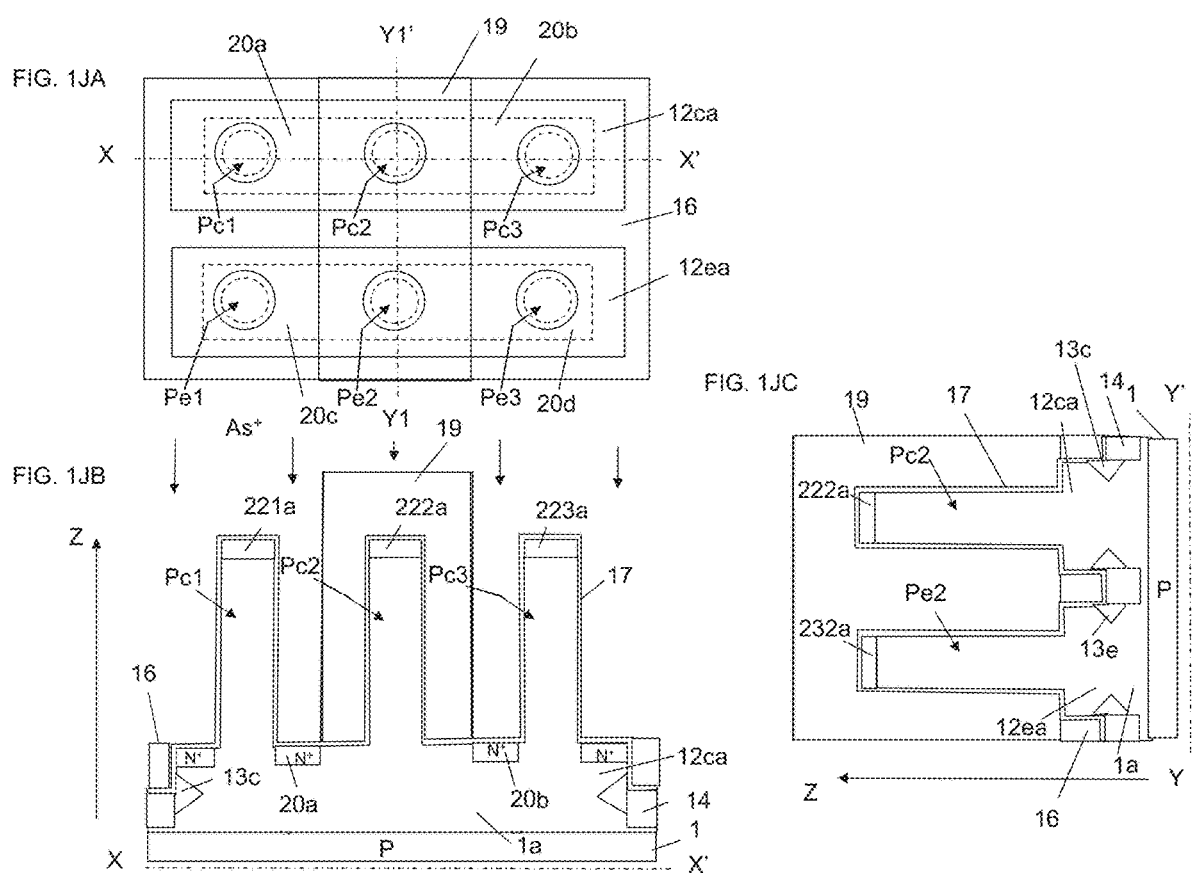

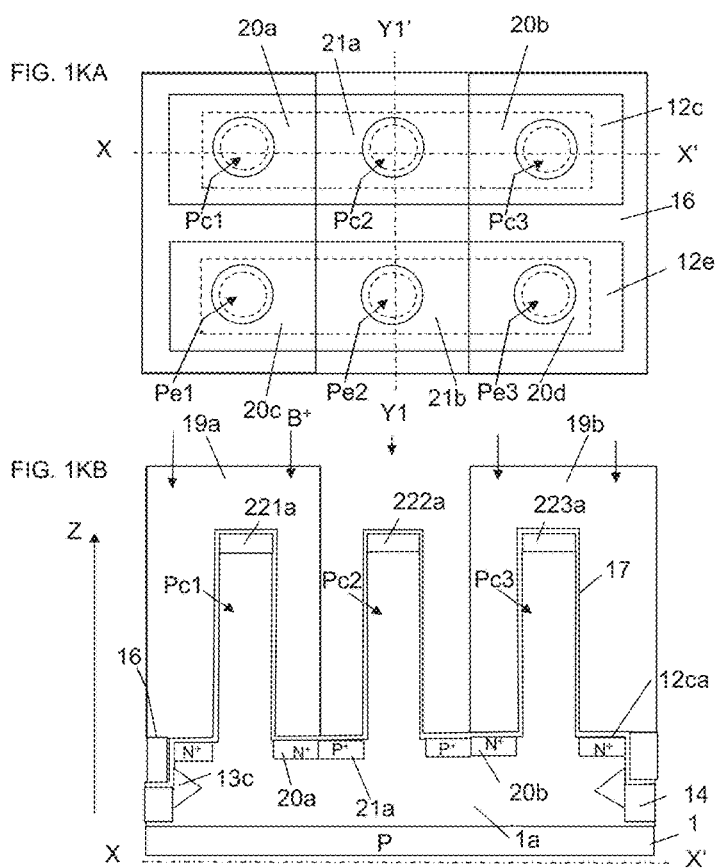
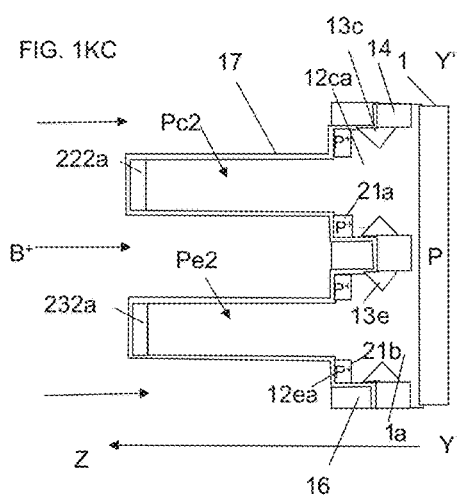

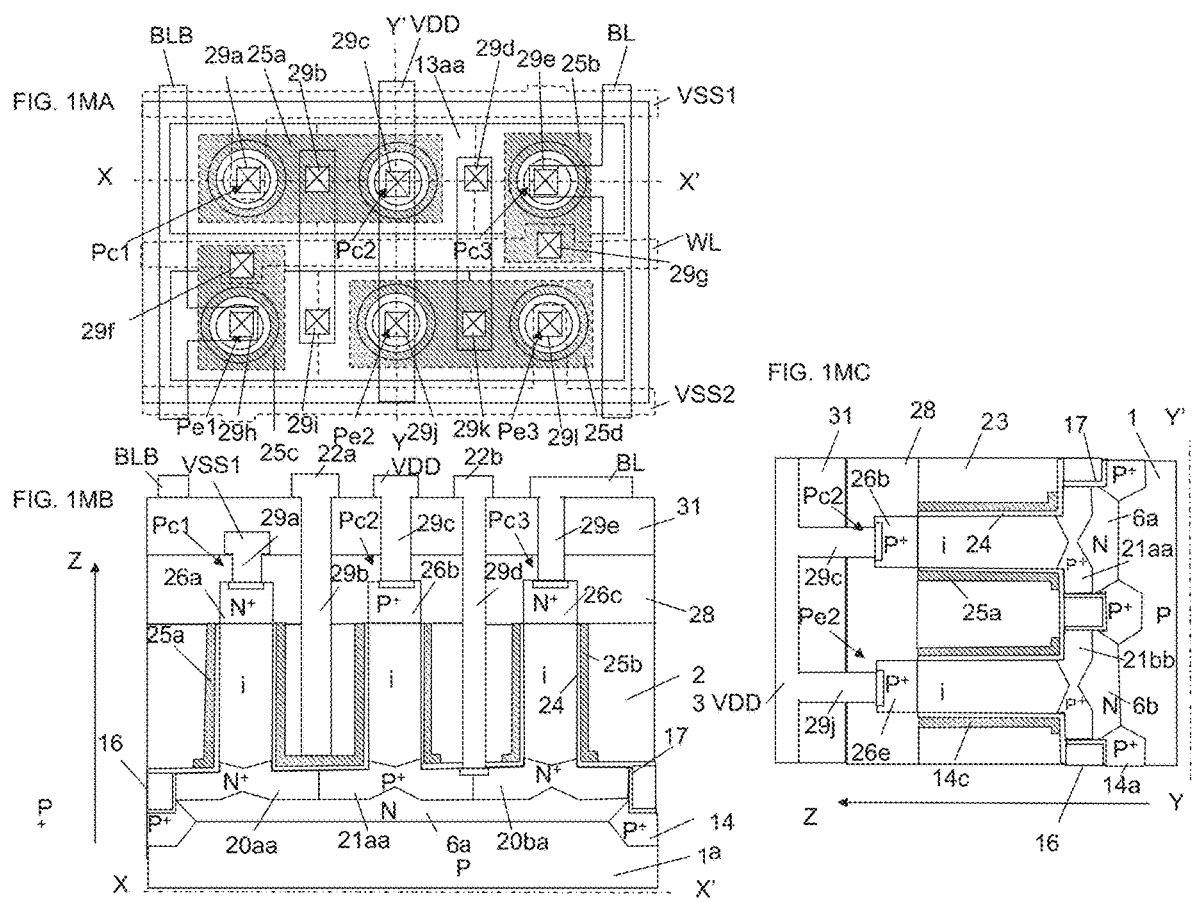

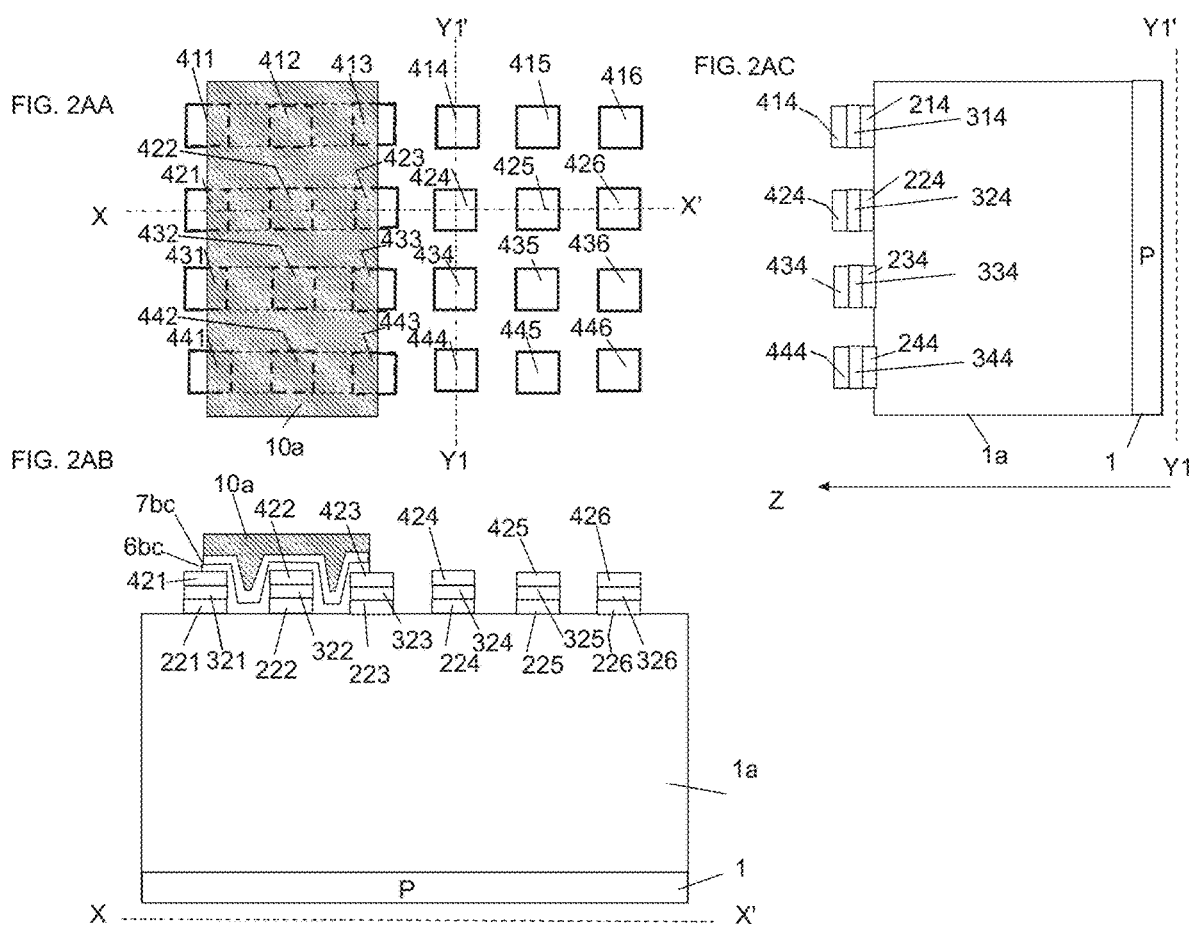

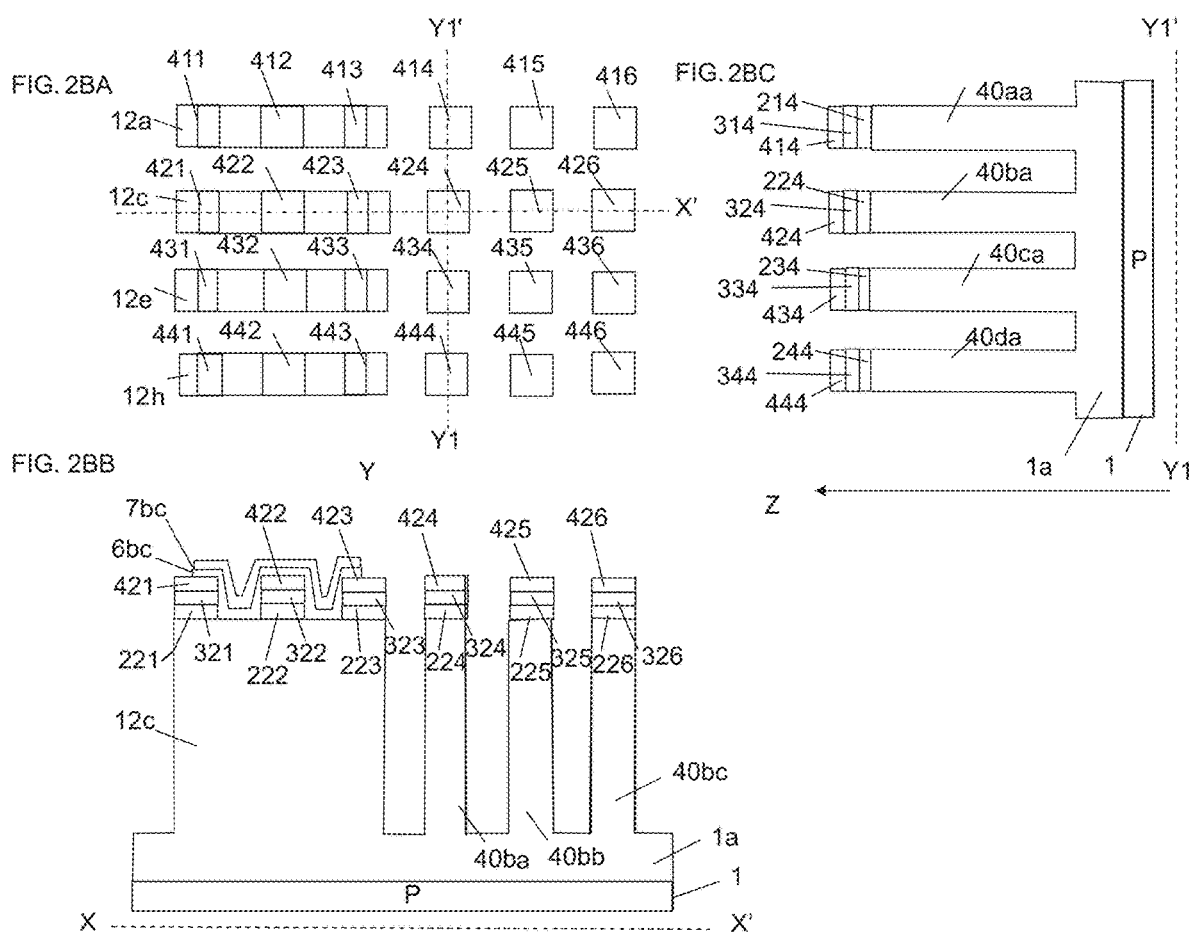

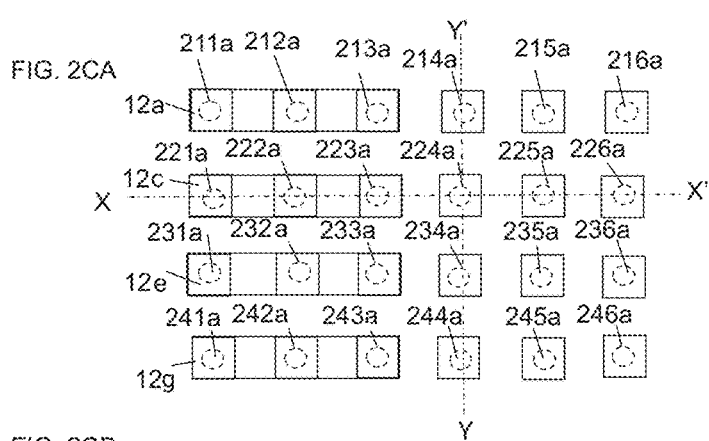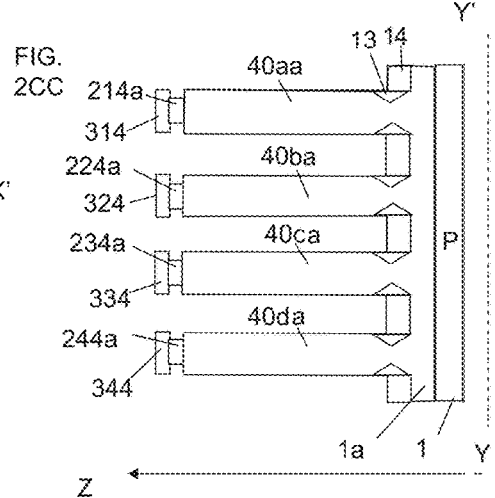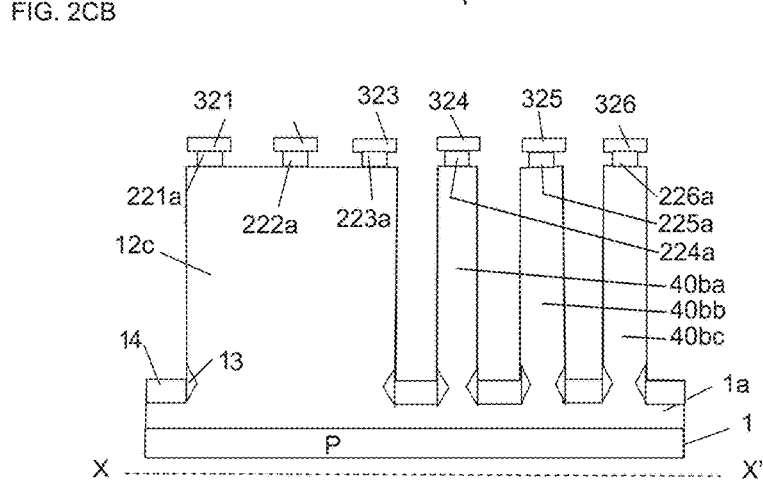

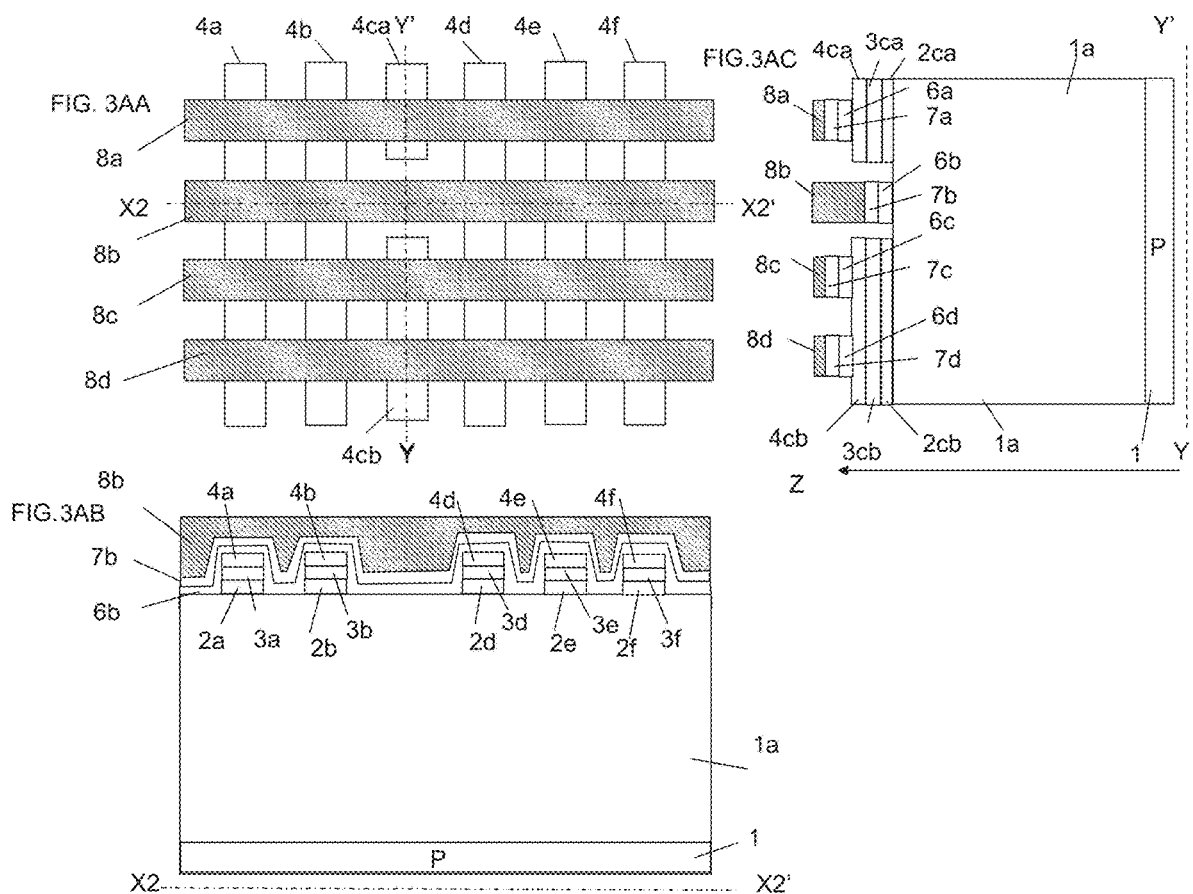

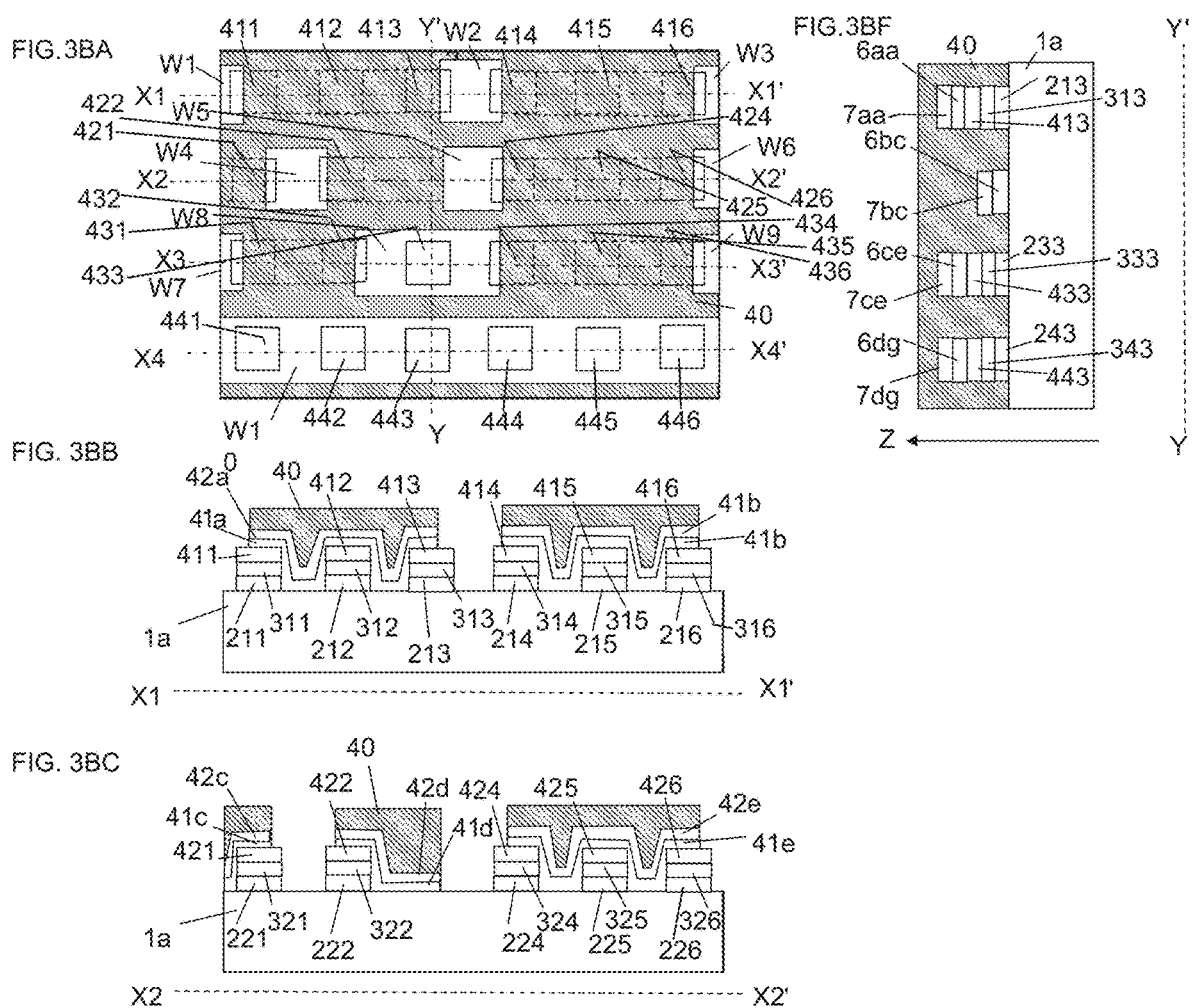

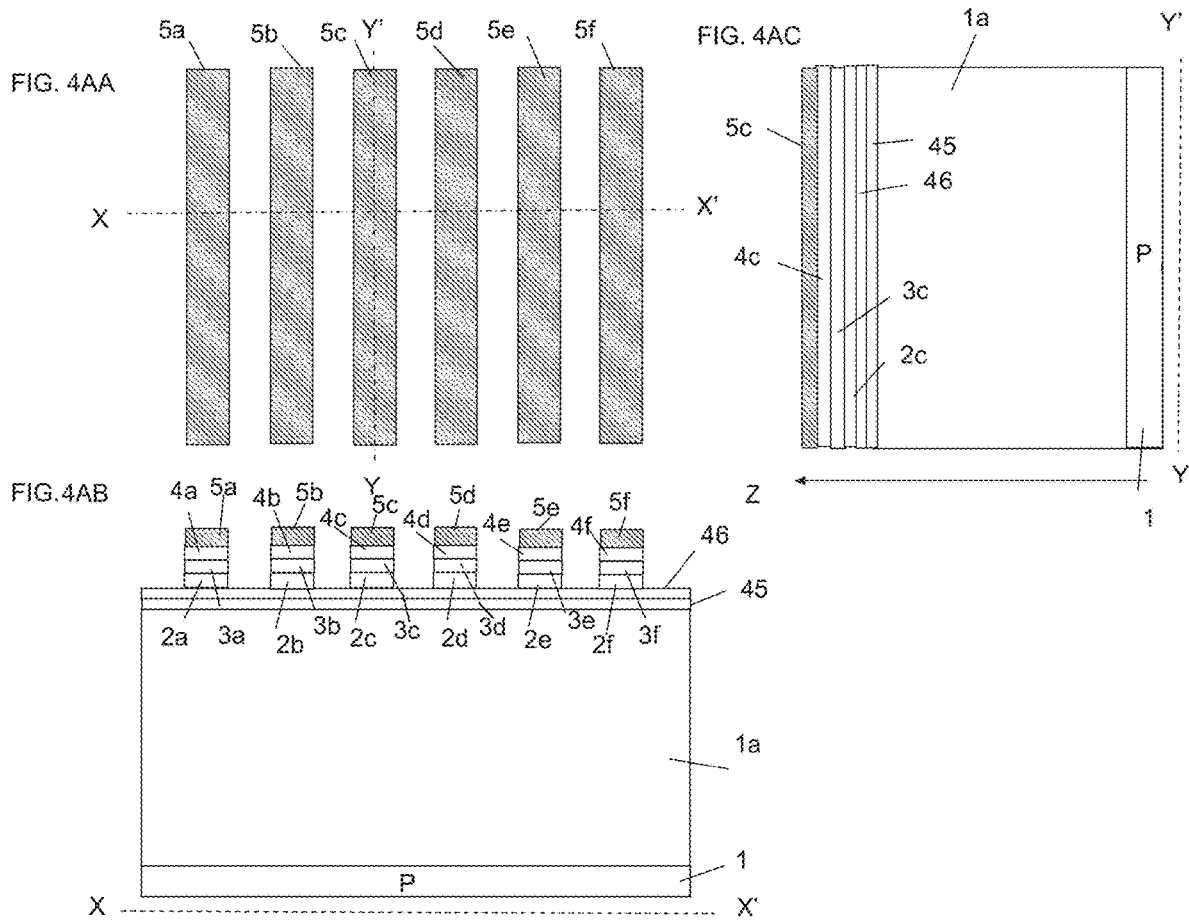

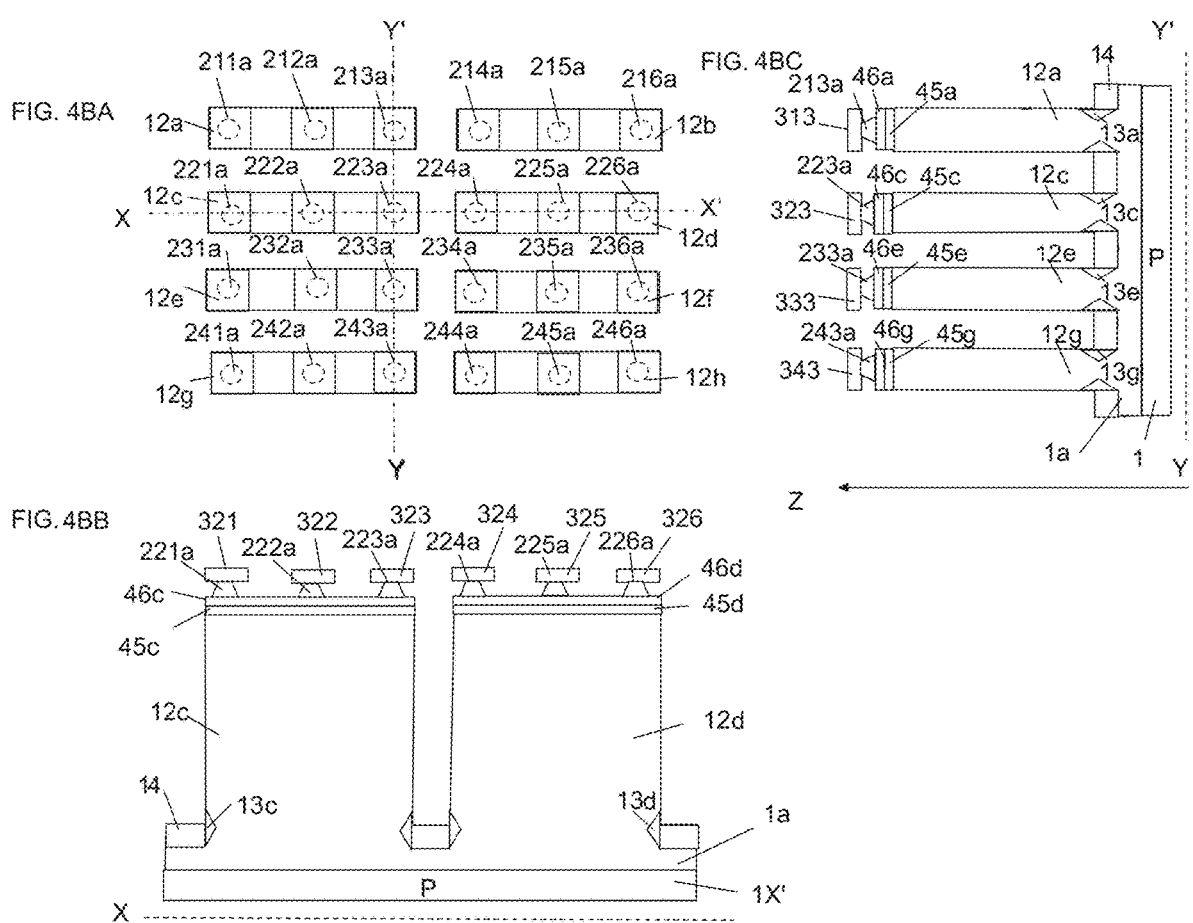

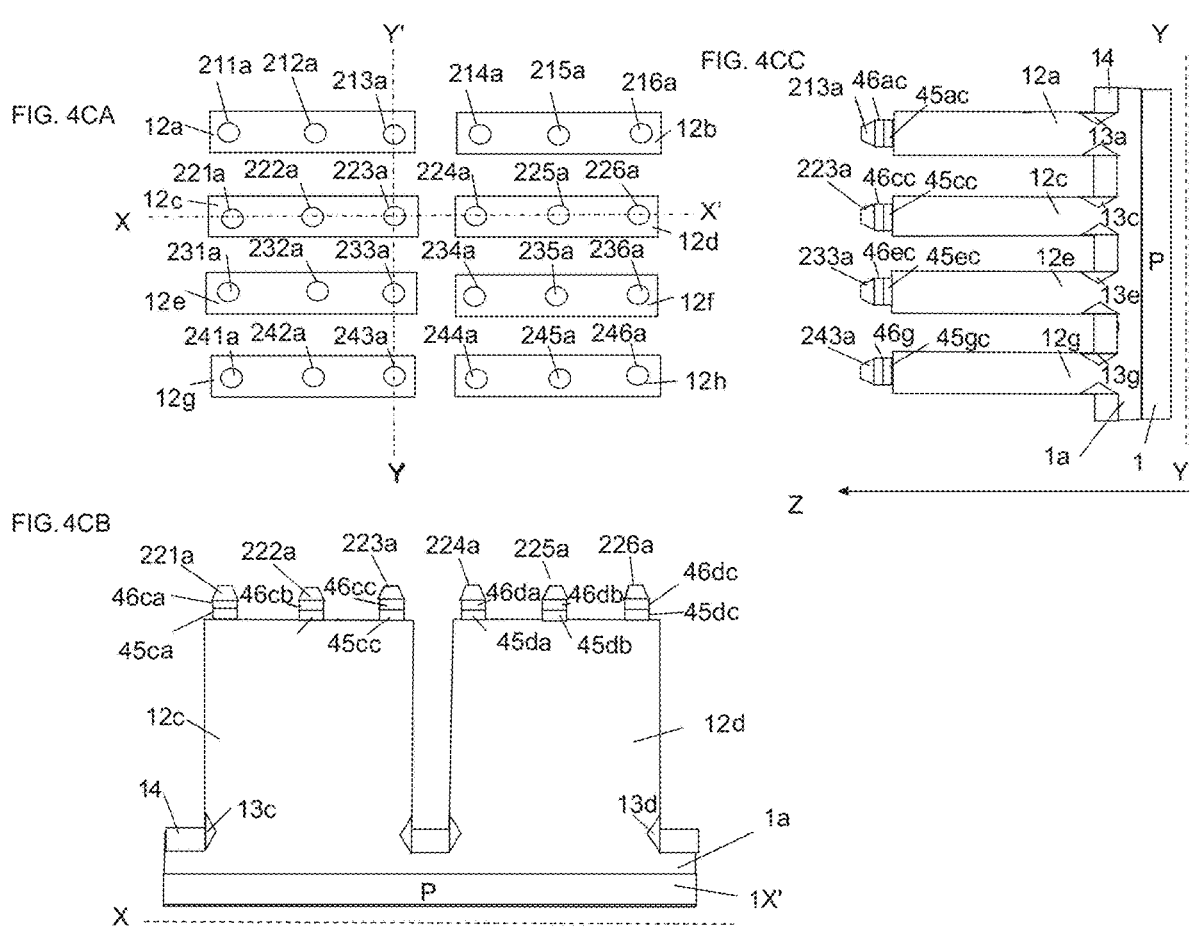

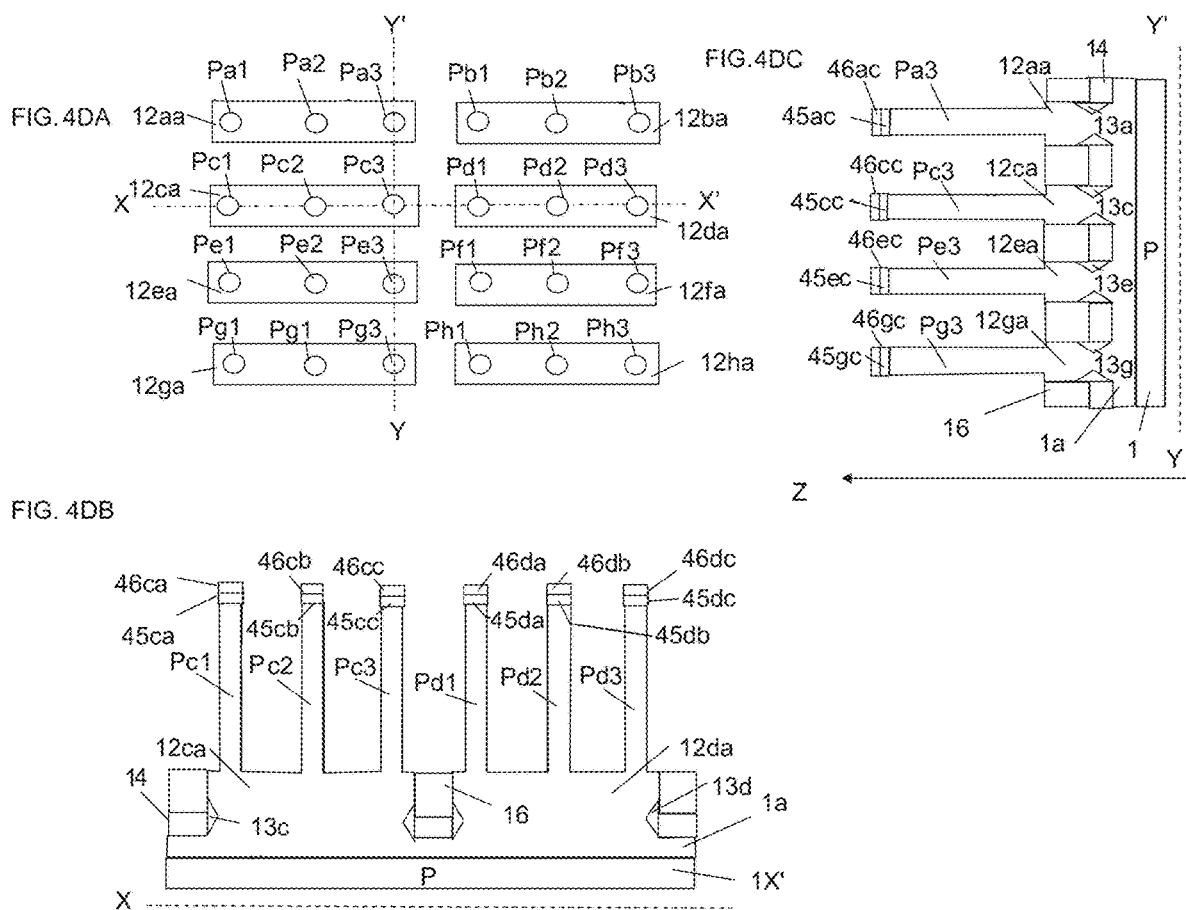

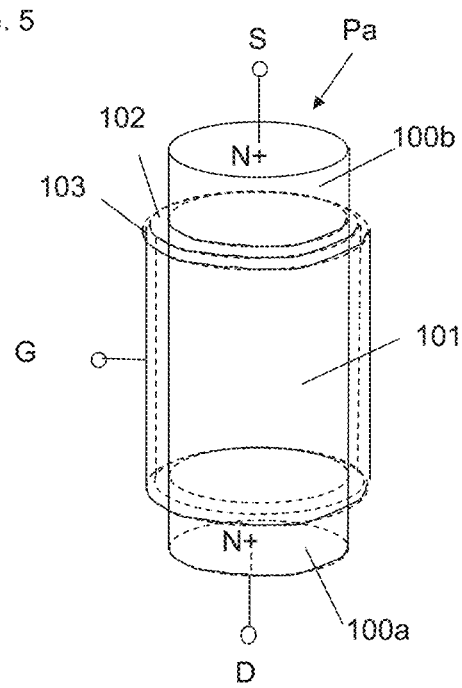

METHOD FOR PRODUCING PILLAR-SHAPED SEMICONDUCTOR DEVICE

CROSS REFERENCES TO RELATED APPLICATIONS

The present application is a continuation application of PCT/JP2016/080529, filed Oct. 14, 2016, the entire contents of which are incorporated herein by reference.

BACKGROUND OF THE INVENTION

1. Field of the Invention

The present invention relates to a method for producing a pillar-shaped semiconductor device.

2. Description of the Related Art

In recent years, surrounding gate transistors (SGTs), which are pillar-shaped semiconductor devices, have been increasingly used as semiconductor elements that provide highly integrated semiconductor devices. Under these circumstances, there is a need for further improvements in density and performance of semiconductor devices including SGTs.

In a planar MOS transistor, a channel is disposed along a surface of a substrate between a source and a drain. By contrast, a channel of an SGT is disposed perpendicularly to a surface of a semiconductor substrate (see, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Thus, compared with planar MOS transistors, SGTs can provide semiconductor devices with higher densities.

FIG. 5 schematically illustrates a structure of an N-channel SGT. A Si pillar Pa (silicon semiconductor pillars are hereinafter referred to as "Si pillars") having P-type conductivity or i-type (intrinsic) conductivity includes in its lower and upper positions $N^+$ regions 100a and 100b (regions containing high concentrations of donor impurities are hereinafter referred to as "$N^+$ regions"), one serving as a source and the other as a drain. A portion of the Si pillar Pa that lies between the $N^+$ regions 100a and 100b is a channel region 101. A gate insulating layer 102 is formed so as to surround the channel region 101, and a gate conductor layer 103 is formed so as to surround the gate insulating layer 102. In the SGT, the $N^+$ regions 100a and 100b, serving as a source and a drain, the channel region 101, the gate insulating layer 102, and the gate conductor layer 103 are formed in or around the single Si pillar Pa. Preferably, the shape of a horizontal section of the Si pillar Pa is circular. In this case, the surface area occupied by the SGT is apparently equal to the area of a single source or drain $N^+$ region of a planar MOS transistor. Accordingly, a circuit chip including SGTs can be even smaller than a circuit chip including planar MOS transistors, resulting in a semiconductor device with a higher density.

FIG. 6 illustrates a sectional view of a CMOS inverter circuit including SGTs (see, for example, U.S. Patent Application Publication No. 2012/0270374).

An i-layer 106 ("i-layer" means an intrinsic Si layer, hereinafter referred to as an "i-layer"), serving as a Si pillar base that supports Si pillars, is formed on an insulating substrate 105, and Si pillars Pb1 and Pb2 for P-channel SGTs and a Si pillar Pb3 for an N-channel SGT are formed on the i-layer 106 (the two P-channel SGTs connected in parallel serve as load transistors, and the N-channel SGT serves as a drive transistor, thereby forming an inverter circuit). The i-layer 106 is a region that defines a region where a CMOS inverter circuit is formed. The i-layer 106 is isolated from adjacent circuits by the insulating substrate 105.

At the same level as the i-layer 106 connected to lower portions of the Si pillars Pb1 and Pb2 for P-channel SGTs, a P-channel-SGT drain $P^+$ region 109a (regions containing high concentrations of acceptor impurities are hereinafter referred to as "$P^+$ regions") is formed so as to surround the lower portions of the Si pillars Pb1 and Pb2. Also at the same level as the i-layer 106, an N-channel-SGT drain $N^+$ region 110a is formed so as to surround a lower portion of the Si pillar Pb3.

Furthermore, P-channel-SGT source $P^+$ regions 109ba and 109bb are formed in top portions of the Si pillars Pb1 and Pb2 for P-channel SGTs, and an N-channel-SGT source $N^+$ region 110b is formed in a top portion of the Si pillar Pb3 for an N-channel SGT.

As illustrated in FIG. 6, gate insulating layers 107a, 107b, and 107c are formed so as to surround the Si pillars Pb1, Pb2, and Pb3. A P-channel-SGT gate conductor layer 108a is formed so as to surround the gate insulating layers 107a and 107b, and an N-channel-SGT gate conductor layer 108b is formed so as to surround the gate insulating layer 107c.

An insulating layer (sidewall nitride film) 111a is formed so as to surround the gate conductor layer 108a and the $P^+$ regions 109ba and 109bb in the top portions of the Si pillars Pb1 and Pb2, and an insulating layer (sidewall nitride film) 111b is formed so as to surround the gate conductor layer 108b and the $N^+$ region 110b in the top portion of the Si pillar Pb3. The P-channel-SGT drain $P^+$ region 109a is connected to the N-channel-SGT drain $N^+$ region 110a through a silicide layer 113.

By arranging the above-described SGTs in the following manner, a CMOS inverter circuit is formed. Contact holes 114a, 114b, 114c, 114d, 114e, and 114f are formed on the gate conductor layer 108a, the $P^+$ region 109ba, the $P^+$ region 109bb, the silicide layer 113, $N^+$ region 110b, and the gate conductor layer 108b, respectively, so as to extend through a $SiO_2$ layer 112 which covers the insulating substrate 105, the i-layer 106, and the Si pillars Pb1, Pb2, and Pb3.

As illustrated in FIG. 6, a power supply wiring metal layer Vcc formed on the $SiO_2$ layer 112 is connected to the P-channel-SGT source $P^+$ regions 109ba and 109bb through the contact holes 114b and 114c. An output wiring metal layer Vout formed on the $SiO_2$ layer 112 is connected to the P-channel-SGT drain $P^+$ region 109a and the N-channel-SGT drain $N^+$ region 110a through the contact hole 114d and the silicide layer 113. Input wiring metal layers Vin1 and Vin2 formed on the $SiO_2$ layer 112 are respectively connected to the P-channel-SGT gate conductor layer 108a and the N channel-SGT gate conductor layer 108b through the contact holes 114a and 114f. A ground wiring metal layer Vss formed on the $SiO_2$ layer 112 is connected to the N-channel-SGT source $N^+$ region 110b through the contact hole 114e.

In this CMOS inverter circuit including SGTs, the P-channel SGTs are formed in the Si pillars Pb1 and Pb2, and the N-channel SGT in the Si pillar Pb3. This configuration reduces the circuit area as viewed from the vertical direction and enables a circuit even smaller than inverter circuits including known planar MOS transistors.

As described above, in the CMOS inverter circuit including SGTs, the Si pillars Pb1, Pb2, and Pb3 are formed on the i-layer 106. The Si pillars Pb1, Pb2, and Pb3 must be formed with high positional accuracy so as not to protrude from an outer periphery of the i-layer 106 in plan view.

A method for forming the Si pillars Pb1, Pb2, and Pb3 on the i-layer 106 will now be described with reference to FIGS. 7AA to 7CB. Among these figures, figures with reference characters that end with the letter A are plan views, and figures with reference characters that end with the letter B are sectional views taken along lines X-X' in the figures with reference characters that end with the letter A.

First, as illustrated in FIGS. 7AA and 7AB, an i-layer 116 is formed on an insulating substrate 105 (corresponding to the insulating substrate 105 in FIG. 6). Subsequently, a $SiO_2$ layer 117 is formed on the i-layer 116 by a thermal oxidation process.

Next, as illustrated in FIGS. 7BA and 7BB, $SiO_2$ layers 118a, 118b, and 118c which are circular in plan view are formed from the $SiO_2$ layer 117 by using a lithographic process and a $SiO_2$ film etching process, the $SiO_2$ layers 118a, 118b, and 118c corresponding to the top portions of the Si pillars Pb1, Pb2, and Pb3. Subsequently, the i-layer 116 is etched using the $SiO_2$ layers 118a, 118b, and 118c which are circular in plan view as masks to form Si pillars Pb1, Pb2, and Pb3 (corresponding to the Si pillars Pb1, Pb2, and Pb3 in FIG. 6). The etching is performed such that the i-layer 116a is left between the insulating substrate 105 and the Si pillars Pb1, Pb2, and Pb3.

Next, as illustrated in FIGS. 7CA and 7CB, using a lithographic process involving mask alignment and a Si etching process, the i-layer 116a is etched in alignment with the Si pillars Pb1, Pb2, and Pb3 except a portion surrounding the Si pillars Pb1, Pb2, and Pb3 in plan view, thereby forming a Si pillar base 106 (corresponding to the i-layer 106 in FIG. 6). In this manner, the Si pillars Pb1, Pb2, and Pb3 are formed on the i-layer 106.

As described above, in the known method, the Si pillars Pb1, Pb2, and Pb3 are formed, and then the Si pillar base 106 which defines a CMOS circuit region is formed by the lithographic process involving mask alignment with the Si pillars Pb1, Pb2, and Pb3. The Si pillars Pb1, Pb2, and Pb3 are required to be formed with high positional accuracy so as not to protrude from the outer periphery of the Si pillar base 106 in plan view. The higher the positional accuracy is, the smaller the CMOS inverter circuit including SGTs can be.

The Si pillar base 106 and the Si pillars Pb1, Pb2, and Pb3 may be formed in the reverse order (see, for example, U.S. Pat. No. 9,224,835). First, an etching mask for forming outlines of the Si pillar base 106 is stacked, and the i-layer 116 is etched. Next, a $SiO_2$ layer and a silicon nitride ($Si_3N_4$) layer are stacked in this order on the i-layer 116 remaining on the Si pillar base 106. Thereafter, three rows of masks are formed on the remaining i-layer 116 along a direction perpendicular to the direction in which the Si pillar base 106 extends, and the $SiO_2$ layer and the $Si_3N_4$ layer are etched into a rectangular shape. The rectangular $SiO_2$ layer is then isotropically etched using the rectangular $Si_3N_4$ layer as an etching mask, thereby forming the $SiO_2$ layers 118a, 118b, and 118c which are circular in plan view. Finally, the rectangular $Si_3N_4$ layer is removed, and the i-layer 116 remaining on the Si pillar base 106 is then etched using the $SiO_2$ layers 118a, 118b, and 118c which are circular in plan view as etching masks to form the Si pillars Pb1, Pb2, and Pb3. In this method, positional accuracy in the direction perpendicular to the direction in which the Si pillar base 106 extends can be improved, but depending on the positional relationship between the mask for forming the rectangular $SiO_2$ and $Si_3N_4$ layers and the Si pillar base 106, the positional relationship between the Si pillars Pb1, Pb2, and Pb3 and the Si pillar base 106 may vary in the direction in which the Si pillar base 106 extends. Thus, there remains a need for accuracy in alignment in the direction in which the Si pillar base 106 extends.

SUMMARY OF THE INVENTION

To achieve a highly integrated CMOS inverter circuit including SGTs, semiconductor pillars (corresponding to the Si pillars Pb1, Pb2, and Pb3 in FIG. 6) that form the SGTs and have horizontal sections that are circular in plan view are required to be formed in a circuit-forming region (corresponding to the i-layer 106 in FIG. 6) with high positional accuracy.

A method for producing a pillar-shaped semiconductor device according to a first aspect of the present invention includes:

a step of forming, on a semiconductor layer, a band-shaped first material layer that extends in a first direction in plan view;

a step of forming, on the band-shaped first material layer, a band-shaped second material layer that extends in a second direction different from the first direction in plan view;

a step of forming an overlapping-portion first material layer at a portion where the band-shaped first material layer overlaps the band-shaped second material layer in plan view by etching the band-shaped first material layer using the band-shaped second material layer as a mask;

a step of forming, on the band-shaped second material layer, a third material layer whose one or both ends are located, in plan view, on two opposite overlapping-portion first material layers among a plurality of the overlapping-portion first material layers aligned in the second direction;

a step of forming a fourth material layer by etching the band-shaped second material layer using the third material layer as a mask;

a step of forming a first semiconductor pillar base by etching the semiconductor layer using the overlapping-portion first material layer and the fourth material layer as etching masks;

a step of removing the fourth material layer; and a step of forming a semiconductor pillar by etching the first semiconductor pillar base using the overlapping-portion first material layer as an etching mask, and a first pillar-shaped semiconductor device including the semiconductor pillar as a channel is formed.

Preferably, the overlapping-portion first material layer includes an upper first material layer and a lower first material layer, each being formed of one or more layers, the method further includes a step of forming a reduced lower first material layer by laterally etching the lower first material layer using the upper first material layer as an etching mask, and the semiconductor pillar is formed by etching the semiconductor layer using the reduced lower first material layer as a mask.

Preferably, the step of forming the fourth material layer is performed so as to leave a region where the fourth material layer is not formed on the overlapping-portion first material layer.

Preferably, after the band-shaped first material layer is formed, a portion of the band-shaped first material layer is removed to form a region where the overlapping-portion first material layer does not exist in plan view.

Preferably, the band-shaped first material layer and the band-shaped second material layer have different widths in plan view.

Preferably, in the step of forming the band-shaped first material layer, a band-shaped fifth material layer having a width different from a width of the band-shaped first material layer in plan view is formed in a region that is on the semiconductor layer and separate from a region where the first pillar-shaped semiconductor device is to be formed.

Preferably, in the step of forming the band-shaped second material layer, a band-shaped sixth material layer having a width different from a width of the band-shaped second material layer in plan view is formed in a region that is on the semiconductor layer and separate from a region where the first pillar-shaped semiconductor device is to be formed.

Preferably, in the step of forming the band-shaped first material layer, a band-shaped seventh material layer that extends in the second direction is formed, and in the step of forming the band-shaped second material layer, a band-shaped eighth material layer that extends in the first direction is formed, the band-shaped seventh material layer and the band-shaped eighth material layer each being formed in a region that is on the semiconductor layer and separate from a region where the first pillar-shaped semiconductor device is to be formed.

Preferably, in the step of forming the third material layer, a window where the third material layer does not exist in plan view is formed, and at least one end of the window is located on the overlapping-portion first material layer.

Preferably, in the step of forming the fourth material layer, a ninth material layer is formed in a region where the overlapping-portion first material layer does not exist, and the method further includes a step of forming a second semiconductor pillar base by etching the semiconductor layer using the ninth material layer as a mask.

Preferably, the method further includes, before the band-shaped first material layer is formed, a step of forming a tenth material layer formed of one or more layers on the semiconductor layer, in the step of forming the first semiconductor pillar base, the first semiconductor pillar base is formed after the tenth material layer is etched using the overlapping-portion first material layer and the fourth material layer as etching masks, and the semiconductor pillar is formed after the tenth material layer is etched using the overlapping-portion first material layer as an etching mask.

Preferably, the tenth material layer under the overlapping-portion first material layer is used as an etching mask for forming the semiconductor pillar.

Preferably, the method further includes, after the first semiconductor pillar base is formed, a step of forming an impurity region containing a donor or acceptor impurity on a surface of the semiconductor layer at an outer periphery of the first semiconductor pillar base in plan view; and a step of forming a side impurity region by diffusing the donor or acceptor impurity laterally into the first semiconductor pillar base by heat treatment.

According to the present invention, a semiconductor pillar constituting an SGT and a semiconductor pillar base are formed with high positional relationship accuracy and high shape accuracy in a circuit-forming region, thus enabling an SGT circuit with higher density and higher performance.

BRIEF DESCRIPTION OF THE DRAWINGS

FIGS. 1AA to 1AC are a plan view and sectional views of a CMOS-type SRAM cell circuit for explaining a method for producing a semiconductor device including SGTs according to a first embodiment.

FIGS. 1BA to 1BC are a plan view and sectional views of a CMOS-type SRAM cell circuit for explaining the method for producing a semiconductor device including SGTs according to the first embodiment.

FIGS. 1CA to 1CC are a plan view and sectional views of a CMOS-type SRAM cell circuit for explaining the method for producing a semiconductor device including SGTs according to the first embodiment.

FIGS. 1DA to 1DC are a plan view and sectional views of a CMOS-type SRAM cell circuit for explaining the method for producing a semiconductor device including SGTs according to the first embodiment.

FIGS. 1EA to 1EC are a plan view and sectional views of a CMOS-type SRAM cell circuit for explaining the method for producing a semiconductor device including SGTs according to the first embodiment.

FIGS. 1FA to 1FC are a plan view and sectional views of a CMOS-type SRAM cell circuit for explaining the method for producing a semiconductor device including SGTs according to the first embodiment.

FIGS. 1GA to 1GC are a plan view and sectional views of a CMOS-type SRAM cell circuit for explaining the method for producing a semiconductor device including SGTs according to the first embodiment.

FIGS. 1HA to 1HC are a plan view and sectional views of a CMOS-type SRAM cell circuit for explaining the method for producing a semiconductor device including SGTs according to the first embodiment.

FIGS. 1IA to 1IC are a plan view and sectional views of a CMOS-type SRAM cell circuit for explaining the method for producing a semiconductor device including SGTs according to the first embodiment.

FIGS. 1JA to 1JC are a plan view and sectional views of a CMOS-type SRAM cell circuit for explaining the method for producing a semiconductor device including SGTs according to the first embodiment.

FIGS. 1KA to 1KC are a plan view and sectional views of a CMOS-type SRAM cell circuit for explaining the method for producing a semiconductor device including SGTs according to the first embodiment.

FIGS. 1MA to 1MC are a plan view and sectional views of a CMOS-type SRAM cell circuit for explaining the method for producing a semiconductor device including SGTs according to the first embodiment.

FIGS. 2AA to 2AC are a plan view and sectional views for explaining a method for producing a semiconductor device including SGTs according to a second embodiment.

FIGS. 2BA to 2BC are a plan view and sectional views for explaining the method for producing a semiconductor device including SGTs according to the second embodiment.

FIGS. 2CA to 2CC are a plan view and sectional views for explaining the method for producing a semiconductor device including SGTs according to the second embodiment.

FIGS. 3AA to 3AC are a plan view and sectional views for explaining a method for producing a semiconductor device including SGTs according to a third embodiment.

FIGS. 4AA to 4AC are a plan view and sectional views for explaining a method for producing a semiconductor device including SGTs according to a fourth embodiment.

FIGS. 4BA to 4BC are a plan view and sectional views for explaining the method for producing a semiconductor device including SGTs according to the fourth embodiment.

FIGS. 4CA to 4CC are a plan view and sectional views for explaining the method for producing a semiconductor device including SGTs according to the fourth embodiment.

FIGS. 4DA to 4DC are a plan view and sectional views for explaining the method for producing a semiconductor device including SGTs according to the fourth embodiment.

FIG. 5 schematically illustrates a structure of a known SGT.

DESCRIPTION OF THE PREFERRED EMBODIMENTS

Figure 1L:
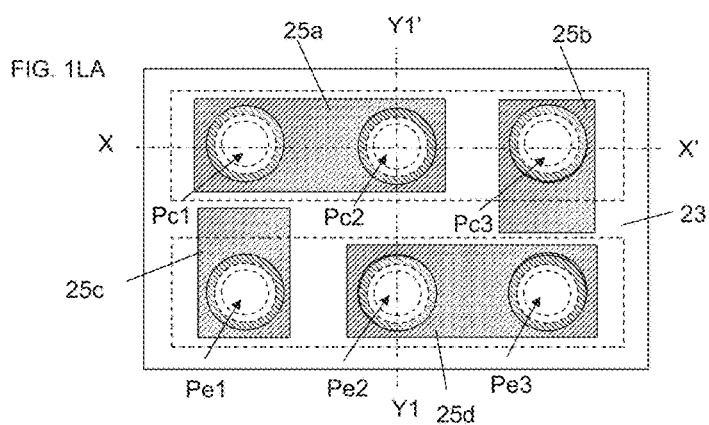
FIGS. 1LA to 1LC are a plan view and sectional views of a CMOS-type SRAM cell circuit for explaining the method for producing a semiconductor device including SGTs according to the first embodiment.
Figure 1L:
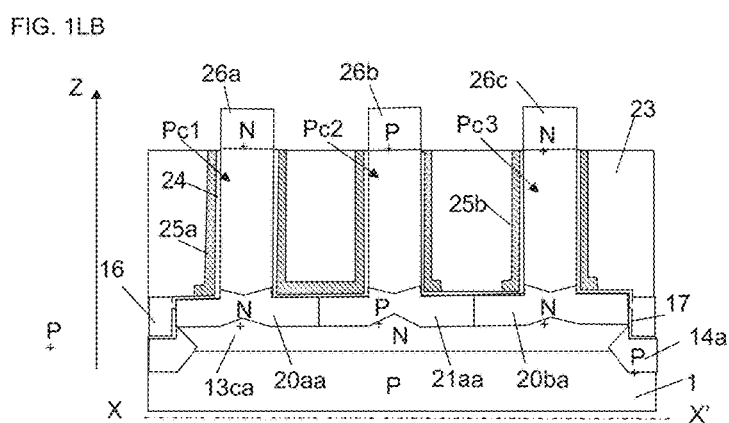
Figure 1L:
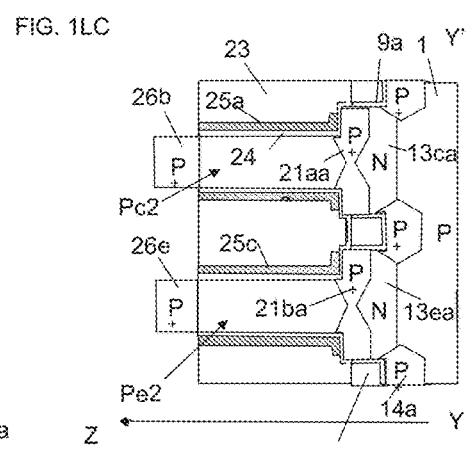

Methods for producing a semiconductor device including SGTs according to embodiments of the present invention will hereinafter be described with reference to the drawings.

First Embodiment

A method for producing a CMOS-type static random access memory (SRAM) cell circuit including SGTs according to a first embodiment of the present invention will now be described with reference to FIGS. 1AA to 1MC. Among FIGS. 1AA to 1MC, figures with reference characters that end with the letter A are plan views, figures with reference characters that end with the letter B are sectional views taken along lines X-X' in the figures with reference characters that end with the letter A, and figures with reference characters that end with the letter C are sectional views taken along line Y-Y' in the figures with reference characters that end with the letter A.

First, as illustrated in FIGS. 1AA to 1AC, an i-layer $1a$ is formed on a P layer substrate 1. Subsequently, a SiO2 layer (not illustrated), a silicon nitride (Si3N4) layer (not illustrated), and a SiO2 layer (not illustrated) are formed in this order from bottom to top on the i-layer $1a$. Subsequently, band-shaped resist layers $5a$ to $5f$ which, in plan view, extend in a first direction (Y-Y' direction) and are aligned in a second direction (X-X' direction) perpendicular to the first direction are stacked, and using these layers as etching masks, the above-mentioned $SiO_2$ layer, $Si_3N_4$ layer, and $SiO_2$ layer are etched by reactive ion etching (RIE) to form, in the following order from bottom to top, $SiO_2$ layers $2a$ to $2f$, $Si_3N_4$ layers $3a$ to $3f$, and $SiO_2$ layers $4a$ to $4f$ under the resist layers $5a$ to $5f$, respectively. The resist layers $5a$ to $5f$ are then removed. The i-layer $1a$ may contain an acceptor or donor impurity in a small amount.

Next, as illustrated in FIGS. 1BA to 1BC, a carbon (C) layer (not illustrated) and a $SiO_2$ layer (not illustrated) are stacked in this order from bottom to top over the entire surface. Subsequently, band-shaped resist layers $8a$ to $8d$ which, in plan view, extend in the second direction and are aligned in the first direction are stacked, and using these layers as etching masks, the above-mentioned carbon (C) layer and $SiO_2$ layer are etched by RIE to form, in the following order from bottom to top, C layers $6a$ to $6d$ and $SiO_2$ layers $7a$ to $7d$ under the resist layers $8a$ to $8d$, respectively.

Next, as illustrated in FIGS. 1CA to 1CC, the $SiO_2$ layers $2a$ to $2f$, the $Si_3N_4$ layers $3a$ to $3f$, and the $SiO_2$ layers $4a$ to $4f$ are etched by RIE using the resist layers $8a$ to $8d$, the C layers $6a$ to $6d$, and the $SiO_2$ layers $7a$ to $7d$ as masks. Preferably, the resist layers $8a$ to $8d$ have the same width as the resist layers $5a$ to $5f$. As a result, $SiO_2$ layers 211 to 216, $Si_3N_4$ layers 311 to 316, and $SiO_2$ layers 411 to 416 are formed under regions where the resist layer $8a$ overlaps the $SiO_2$ layers $2a$ to $2f$, the $Si_3N_4$ layers $3a$ to $3f$, and the $SiO_2$ layers $4a$ to $4f$. $SiO_2$ layers 221 to 226, $Si_3N_4$ layers 321 to 326, and $SiO_2$ layers 421 to 426 are formed under regions where the resist layer $8b$ overlaps the $SiO_2$ layers $2a$ to $2f$, the $Si_3N_4$ layers $3a$ to $3f$, and the $SiO_2$ layers $4a$ to $4f$. $SiO_2$ layers 231 to 236, $Si_3N_4$ layers 331 to 336, and $SiO_2$ layers 431 to 436 are formed under regions where the resist layer $8c$ overlaps the $SiO_2$ layers $2a$ to $2f$, the $Si_3N_4$ layers $3a$ to $3f$, and the $SiO_2$ layers $4a$ to $4f$. $SiO_2$ layers 241 to 246, $Si_3N_4$ layers 341 to 346, and $SiO_2$ layers 441 to 446 are formed under regions where the resist layer $8d$ overlaps the $SiO_2$ layers $2a$ to $2f$, the $Si_3N_4$ layers $3a$ to $3f$, and the $SiO_2$ layers $4a$ to $4f$. The above-described layers may each have any shape, such as a substantially rectangular, substantially circular, substantially elliptic, or substantially oval shape.

Next, as illustrated in FIGS. 1DA to 1DC, resist layers $10a$ and $10b$ which extend in the first direction in plan view are formed. One end of the resist layer $10a$ in the second direction is located on the $SiO_2$ layers 411, 421, 431, and 441, and the other end is located on the $SiO_2$ layers 413, 423, 433, and 443. One end of the resist layer $10b$ in the second direction is located on the $SiO_2$ layers 414, 424, 434, and 444, and the other end is located on the $SiO_2$ layers 416, 426, 436, and 446. Subsequently, the $SiO_2$ layers $7a$, $7b$, $7c$, and $7d$ and the C layers $6a$, $6b$, $6c$, and $6d$ are etched using the resist layers $10a$ and $10b$ as etching masks. As a result, under regions where the resist layer $10a$ overlaps the $SiO_2$ layers $7a$, $7b$, $7c$, and $7d$, C layers $6aa$, $6bc$, $6ce$, and $6dg$ and $SiO_2$ layers $7aa$, $7bc$, $7ce$, and $7dg$ there above are formed. Under regions where the resist layer $10b$ overlaps the $SiO_2$ layers $7a$, $7b$, $7c$, and $7d$, C layers $6ab$, $6bd$, $6cf$, and $6dh$ and $SiO_2$ layers $7ab$, $7bd$, $7cf$, and $7dh$ there above are formed. The resist layers $10a$ and $10b$ are then removed.

Next, as illustrated in FIGS. 1EA to 1EC, when a region along line X-X' in FIG. 1EA is viewed, the upper surface of the i-layer $1a$ is covered with the $SiO_2$ layers 421, $7bc$, and 423 on the left side and with the $SiO_2$ layers 424, $7bd$, and 426 on the right side. This applies to other regions. Using the $SiO_2$ layers 421, $7bc$, and 423 as etching masks, a band-shaped Si pillar base $12c$ is formed by etching the i-layer $1a$ by RIE. Using the SiO$_2$ layers 424, 7bd, and 426 as etching masks, a band-shaped Si pillar base 12d is formed. Likewise, in the other regions, band-shaped Si pillar bases 12a, 12b, 12e, 12f, 12g, and 12h are respectively formed under the SiO$_2$ layers 7aa, 7ab, 7ce, 7cf, 7dg, and 7dh and the SiO$_2$ layers underlying two ends of the SiO$_2$ layers. Referring to the band-shaped Si pillar base 12c, its one end in the second direction in plan view is coincident with the left end of the SiO$_2$ layer 421, and the other end is coincident with the right end of the SiO$_2$ layer 423. Further referring to the band-shaped Si pillar base 12c, its two ends in the vertical direction in plan view are coincident with two ends of the SiO$_2$ layers 421, 422, and 423. This relationship also applies to other band-shaped Si pillar bases 12a, 12b, and 12d to 12h.

Next, as illustrated in FIGS. 1FA to 1FC, arsenic (As) ions are implanted from above the i-layer 1a onto a surface of the i-layer 1a at outer peripheries of the band-shaped Si pillar bases 12a to 12h. Thereafter, the As atoms are thermally diffused into the band-shaped Si pillar bases 12a to 12h by heat treatment to form N layers 13a to 13h (only 13a, 13c, 13d, 13e, and 13g are illustrated) respectively at the outer peripheries of the band-shaped Si pillar bases 12a to 12h and insides of lower surfaces of the band-shaped Si pillar bases 12a to 12h connected to the outer peripheries. Subsequently, boron (B) ions are implanted from above the i-layer 1a onto the surface of the i-layer 1a at the outer peripheries of the band-shaped Si pillar bases 12a to 12h to form a P$^+$ layer 14. Subsequently, a SiO$_2$ layer 14 is formed on outer peripheries of the band-shaped Si pillar bases 12a to 12h.

Next, as illustrated in FIGS. 1GA to 1GC, the SiO$_2$ layers 7aa to 7dh are removed by RIE, and then the C layers 6aa to 6dh are removed by combustion (ashing). Subsequently, the SiO$_2$ layers 411 to 416, 421 to 426, 431 to 436, and 441 to 446 are removed by RIE. Subsequently, the SiO$_2$ layers 211 to 216, 221 to 226, 231 to 236, and 241 to 246 are isotropically etched from their side surfaces, for example, by plasma etching using the Si$_3$N$_4$ layers 311 to 316, 321 to 326, 331 to 336, and 341 to 346 as masks, thereby forming SiO$_2$ layers 211a to 216a, 221a to 226a, 231a to 236a, and 241a to 246a which are circular in plan view.

Next, as illustrated in FIGS. 1HA to 1HC, the Si$_3$N$_4$ layers 311 to 316, 321 to 326, 331 to 336, and 341 to 346 are removed. Subsequently, the band-shaped Si pillar bases 12a to 12h are etched by RIE using the SiO$_2$ layers 211a to 216a, 221a to 226a, 231a to 236a, and 241a to 246a as masks such that band-shaped Si pillar bases 12aa to 12ha are left at the bottom, thereby forming Si pillars Pa1 to Ph3. Subsequently, a thin Si$_3$N$_4$ layer (not illustrated) is deposited over the entire surface. Subsequently, a SiO$_2$ layer (not illustrated) is deposited over the entire surface by chemical vapor deposition (CVD). The surface of the SiO$_2$ layer is then planarized by chemical mechanical polishing (CMP). Thereafter, the SiO$_2$ layer is etched by an etch-back process using RIE to a level at upper surfaces of the band-shaped Si pillar bases 12aa to 12ha, thereby forming a SiO$_2$ layer 16 at regions outside the band-shaped Si pillar bases 12aa to 12ha.

Hereinafter, description will be given focusing on peripheries of the Si pillar bases 12ca and 12ea because the same structure is repeated. Therefore, FIGS. 1IA to 1MC are enlarged views of a dotted region B in FIG. 1HA. As illustrated in FIGS. 1IA to 1IC, Si pillars Pc1 to Pc3 and Pe1 to Pe3 are formed on the band-shaped Si pillar bases 12ca and 12ea. The SiO$_2$ layers 221a to 223a and 231a to 233a are disposed on the Si pillars Pc1 to Pc3 and Pe1 to Pe3, respectively. The P±layer 14 is formed on the surface of the i-layer 1a so as to surround the band-shaped Si pillar bases 12ca and 12ea. The N layers 13c and 13e are formed on outer peripheries of the band-shaped Si pillar bases 12ca and 12ea. Preferably, the end positions (indicated by dotted lines C1 and C2 in FIG. 1A) of the N layers 13c and 13e in the band-shaped Si pillar bases 12ca and 12ea in plan view are outside the Si pillars Pc1 to Pc3 and Pe1 to Pe3. Although As and B atoms reflected from the surface of the i-layer 1a may be implanted into side surfaces of the band-shaped Si pillar bases 12a to 12h during the ion implantation of As and B illustrated in FIGS. 1FA to 1FC, such side portions are removed by the RIE for forming the Si pillars Pa1 to Ph3 illustrated in FIGS. 1HA to 1HC. Furthermore, a thin Si$_3$N$_4$ layer 17 is formed over the entire surface. The SiO$_2$ layer 16 is formed at regions outside the band-shaped Si pillar bases 12ca and 12ea.

Next, as illustrated in FIGS. 1JA to 1JC, a resist layer 19 which covers the Si pillars Pc2 and Pe2 and extends in the direction of line Y-Y' is formed by lithography. Subsequently, by As ion implantation using the resist layer 19 and the SiO$_2$ layers 16, 221a, 223a, 231a, and 232a as masks, N$^+$ regions 20a, 20b, 20c, and 20d are formed on surfaces of the band-shaped Si pillar bases 12ca and 12ea at outer peripheries of the Si pillars Pc1, Pe1, Pc3, and Pe3. Thereafter, the resist layer 19 is removed.

Next, as illustrated in FIGS. 1KA to 1KC, a resist layer 19a which covers the Si pillars Pc1 and Pe1 and a resist layer 19b which covers the Si pillars Pc3 and Pe3 are formed by lithography. Using B ion implantation, a P$^+$ region 21a is formed on a surface of the band-shaped Si pillar base 12ca at an outer periphery of the Si pillar Pc2 between the N$^+$ regions 20a and 20b, and a P$^+$ region 21b is formed on a surface of the band-shaped Si pillar base 12ea at an outer periphery of the Si pillar Pe2 between the N$^+$ regions 20c and 20d. Subsequently, the Si$_3$N$_4$ layer 17 covering the Si pillars Pc1 to Pc3 and Pe1 to Pe3 and the SiO$_2$ layers 221a to 223a and 231a to 233a on the top of the Si pillars Pc1 to Pc3 and Pe1 to Pe3 are removed by etching.

Next, as illustrated in FIGS. 1LA to 1LC, by performing a heat treatment, the P$^+$ layer 14 is extended to the outer peripheries of the band-shaped Si pillar bases 12ca and 12ea to form a P$^+$ region 14a; the N layers 13c and 13e are extended to the central parts of the band-shaped Si pillar bases 12ca and 12ea to form N regions 13ca and 13ea; the N$^+$ regions 20a, 20b, 20c, and 20d are extended to below the Si pillars Pc1, Pc3, Pe1, and Pe3 to form N$^+$ regions 20aa, 20ba, 20ca, and 20da; and the P$^+$ regions 21a and 21b are extended to below the Si pillars Pc2 and Pe2 to form P$^+$ regions 21aa and 21ba. Subsequently, the entire surface is covered with a hafnium oxide (HfO$_2$) layer 24 and a titanium nitride (TiN) layer (not illustrated) by atomic layer deposition (ALD). Subsequently, a TiN layer 25a which surrounds the Si pillars Pc1 and Pc2, a TiN layer 25b which surrounds the Si pillar Pc3, a TiN layer 25c which surrounds the Si pillar Pe1, and a TiN layer 25d which surrounds the Si pillars Pe2 and Pe3 are formed by lithography and RIE. Subsequently, a SiO$_2$ layer (not illustrated) is formed by CVD so as to cover the entire surface. Subsequently, a SiO$_2$ layer 23 whose upper surface is located at a level lower than the top of the Si pillars Pc1 to Pc3 and Pe1 to Pe3 is formed by CMP and an RIE etch-back process. The TiN layers and the HfO$_2$ layers on the top of the Si pillars Pc1 to Pc3 and Pe1 to Pe3 are then etched away using the SiO$_2$ layer 23 as a mask. Subsequently, using lithography and ion implantation, N$^+$ regions 26a, 26c, 26d, and 26f are formed in the top portions of the Si pillars Pc1, Pc3, Pe1, and Pe3, and P$^+$ regions 26b and 26e are formed in the top portions of the Si pillars Pc2 and Pe2.

Next, as illustrated in FIGS. 1MA to 1MC, after a SiO$_2$ layer 28 is deposited by CVD, the surface of the SiO$_2$ layer 28 is planarized by CMP. Subsequently, a contact hole 29*a* is formed on the Si pillar Pc1, and a contact hole 29*l* is formed on the Si pillar Pe3. A contact hole 29*f* is formed on the TiN layer 25*c*, and a contact hole 29*g* is formed on the TiN layer 25*b*. Subsequently, ground wiring metal layers VSS1 and VSS2 respectively connected to the N$^+$ regions 26*a* and 26*c* through the contact holes 29*a* and 29*l* and a word wiring metal layer WL connected to the TiN layers 25*b* and 25*c* through the contact holes 29*f* and 29*g* are formed.

Subsequently, after a SiO$_2$ layer 31 is formed by CVD, the surface of the SiO$_2$ layer 31 is planarized by CMP. Subsequently, contact holes 29*b* and 29*k* are formed on the TiN layers 25*a* and 25*d*, and contact holes 29*c* and 29*j* are formed on the P$^+$ regions 26*b* and 26*e*. A contact hole 29*d* is formed on the boundary between the P$^+$ region 21*aa* and the N$^+$ region 20*ba*, and a contact hole 29*i* is formed on the boundary between the P$^+$ region 21*bb* and the N$^+$ region 20*ca*.

Subsequently, an inverted bit-line wiring metal layer BLB connected to the N$^+$ region 26*d* through a contact hole 29*h*, a power supply wiring metal layer VDD connected to the P$^+$ regions 26*b* and 26*e* through the contact holes 29*c* and 29*j*, a wiring metal layer 22*a* connected to the TiN layer 25*a*, the N$^+$ region 20*ca*, and the P$^+$ region 21*bb* through the contact holes 29*b* and 29*j*, a wiring metal layer 22*b* connected to the TiN layer 25*d*, the N$^+$ region 20*ba*, and the P$^+$ region 21*aa*, and a bit-line wiring metal layer BL connected to the N$^+$ region 26*c* through a contact hole 29*e* are formed. As a result, an SRAM cell circuit including SGTs is formed.

The first embodiment of the present invention provides the following effects.

1. The position and shape of the Si pillars Pa1 to Ph3 depend on the position of overlapping regions of the band-shaped resist layers 8*a* to 8*d* and the band-shaped resist layer 5*a* perpendicular to each other in plan view. The band-shaped resist layers 5*a* to 5*f* and the band-shaped resist layers 8*a* to 8*d* do not require high mask alignment accuracy in lithography in the first and second directions. This enables the Si pillars Pa1 to Ph3 to be readily formed with high accuracy.

2. The positional relationship and shape of the Si pillars Pa1 to Ph3 and the band-shaped Si pillar bases 12*aa* to 12*ha* depend on the position of overlapping regions of the band-shaped resist layers 8*a* to 8*d* and the band-shaped resist layer 5*a* perpendicular to each other in plan view. The band-shaped Si pillar bases 12*aa* to 12*ha*, when viewed in plan, are coincident with the Si pillar bases 12*a* to 12*h* illustrated in FIGS. 1EA to 1EC. For example, referring to the dotted region A in FIG. 1EA, one end of the band-shaped Si pillar base 12*c* in the second direction is coincident with the left end of the SiO$_2$ layer 421, and the other end is coincident with the right end of the SiO$_2$ layer 423. This is because the resist layer 10*a* is formed so as to have its two ends in the second direction located on the SiO$_2$ layers 421 and 423, after which the SiO$_2$ layer 7*b* and the C layer 6*b* are etched using the resist layer 10*a* as a mask, whereby the SiO$_2$ layers 421, 7*bc*, and 423 whose upper surfaces serve as masks for Si etching are formed, as illustrated in FIGS. 1DA to 1DC and FIGS. 1EA to 1EC. The two ends of the resist layer 10*a* in the second direction only need to be located on the SiO$_2$ layers 421 and 423 and thus do not require high mask alignment accuracy. Two ends in the first direction in plan view are coincident with two ends of the SiO$_2$ layers 421, 422, and 423 which are located on and have the same shape as the Si$_3$N$_4$ layers 321, 322, and 323 used to form the Si pillars Pc1, Pc2, and Pc3. This means that the Si pillars Pa1 to Ph3 and the band-shaped Si pillar bases 12*aa* to 12*ha* at the bottoms thereof are readily formed with high positional relationship accuracy and high shape accuracy. This leads to the formation of an SGT circuit with high density and high performance.

3. Although this embodiment has been described in the context of forming an SRAM cell including six SGTs, the number of overlapping regions covered by the resist layers 10*a* and 10*b* may be adjusted to change the number of SGTs constituting an SRAM cell in the step illustrated in FIGS. 1DA to 1DC. For example, in the case of an SRAM cell including eight SGTs, the resist layers 10*a* and 10*b* in FIGS. 1DA to 1DC are formed so as to cover four of the SiO$_2$ layers 411 to 446 aligned in the second direction (X-X' direction). To form an inverter circuit, the resist layers 10*a* and 10*b* are formed so as to cover two of the SiO$_2$ layers 411 to 446 aligned in the second direction. That is, the method according to this embodiment allows any two or more Si pillars to be readily formed on band-shaped Si pillar bases along the second direction in one circuit with high accuracy and high density.

4. This embodiment has been described in the context of forming any two or more Si pillars on band-shaped Si pillar bases along the second direction. On the other hand, rotating the relationship between the band-shaped resist layers 5*a* to 5*f* and the band-shaped resist layers 8*a* to 8*d* illustrated in FIGS. 1AA to 1AC and FIGS. 1BA to 1BC by 90° enables any two or more Si pillars to be readily formed on band-shaped Si pillar bases on the same P layer substrate along the first direction (Y-Y' direction) with high accuracy and high density. This enables a circuit in which any two or more Si pillars aligned in the first and second directions are formed on band-shaped Si pillar bases to be arranged on the same P layer substrate 1 depending on the circuit design. This leads to a circuit with higher density and higher performance.

5. In the description of this embodiment, the Si pillars Pa1 to Ph3 which are circular in plan view are formed with the band-shaped resist layers 5*a* to 5*f* and the band-shaped resist layers 8*a* to 8*d* having the same width. However, the shape and interval of the Si pillars Pa1 to Ph3 can easily be changed by changing the width and interval of the band-shaped resist layers 5*a* to 5*f* and the band-shaped resist layers 8*a* to 8*d*. Depending on the circuit region, a circuit including Si pillars having different shapes and intervals in plan view can be formed. This leads to a circuit with higher density and higher performance.

Second Embodiment

A method for producing a pillar-shaped semiconductor device according to a second embodiment of the present invention will now be described with reference to FIGS. 2AA to 2DC. Figures with reference characters that end with the letter A are plan views, figures with reference characters that end with the letter B are sectional views taken along lines X-X' in the figures with reference characters that end with the letter A, and figures with reference characters that end with the letter C are sectional views taken along lines Y1-Y1' in the figures with reference characters that end with the letter A.

In FIGS. 2AA to 2AC, the left-half region in FIG. 2AA has the same structure as illustrated in FIGS. 1DA to 1DC. One end of the band-shaped resist layer 10*a* in the second direction is located on the SiO$_2$ layers 411, 421, 431, and 441, and the other end is located on the SiO$_2$ layers 413, 423, 433, and 443. The right-half region in FIG. 2AA has the same structure as illustrated in FIGS. 1DA to 1DC except that the band-shaped resist layer 10b is not formed. Using the resist layer 10a as a mask, the SiO$_2$ layers 7a, 7b, 7c, and 7d and the C layers 6a, 6b, 6c, and 6d are etched. In the left-half region in FIG. 2AA, the SiO$_2$ layers 7aa, 7bc, 7ce, and 7dg and the C layers 6aa, 6bc, 6ce, and 6dg are formed as in FIGS. 1DA to 1DC. In the right-half region in FIG. 2AA, the SiO$_2$ layers 1ab, 7bd, 7cf, and 7df and the C layers 6ab, 6bd, 6cf, and 6dh are not formed unlike in FIGS. 1DA to 1DC. In the right-half region in FIG. 2AA, the entire upper surfaces of the SiO$_2$ layers 414 to 416, 424 to 426, 434 to 436, and 444 to 446 are exposed in plan view. The band-shaped resist layer 10a is then removed.

Next, as illustrated in FIGS. 2BA to 2BC, the i-layer 1a is etched by RIE. The left-half region in FIG. 2BA has the same structure as illustrated in FIGS. 1EA to 1EC. In the right-half region in FIG. 2BA, i-layers 40aa to 40ac (only 40aa is illustrated), 40ba to 40bc, 40ca to 40cc (only 40ca is illustrated), and 40da to 40dc (only 40da is illustrated) are respectively formed under the SiO$_2$ layers 414 to 416, 424 to 426, 434 to 436, and 444 to 446 used as etching masks.

Next, as illustrated in FIGS. 2CA to 2CC, the SiO$_2$ layers 7aa, 7bc, 7ce, and 7dg and the C layers 6aa, 6bc, 6ce, and 6dg are removed. Subsequently, the SiO$_2$ layers 411 to 416, 421 to 426, 431 to 436, and 441 to 446 are removed by RIE. Subsequently, the SiO$_2$ layers 211 to 216, 221 to 226, 231 to 236, and 241 to 246 are isotropically etched from their side surfaces, for example, by plasma etching using the Si$_3$N$_4$ layers 311 to 316, 321 to 326, 331 to 336, and 341 to 346 as masks, thereby forming the SiO$_2$ layers 211a to 216a, 221a to 226a, 231a to 236a, and 241a to 246a which are circular in plan view.

Figure 2D:
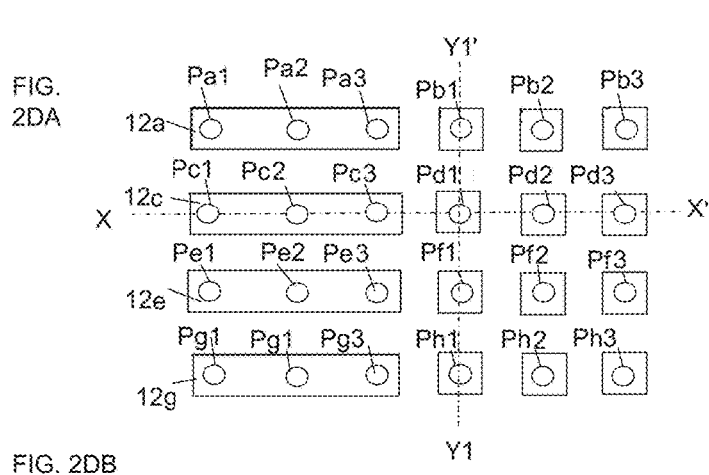
FIGS. 2DA to 2DC are a plan view and sectional views for explaining the method for producing a semiconductor device including SGTs according to the second embodiment.
Figure 2D:
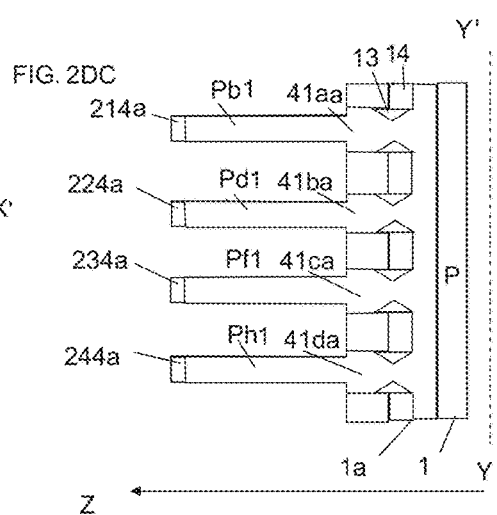
Figure 2D:
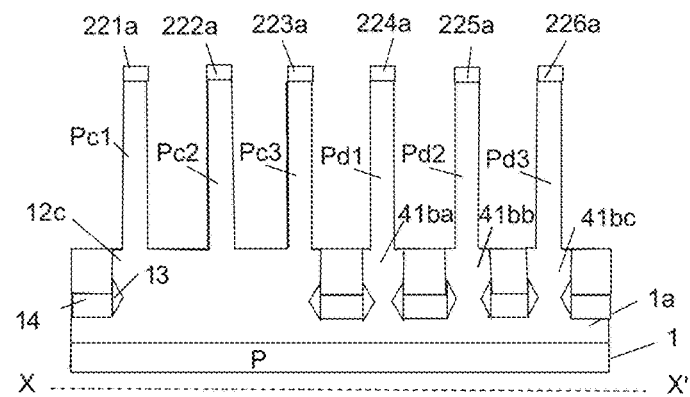

Next, as illustrated in FIGS. 2DA to 2DC, the Si$_3$N$_4$ layers 311 to 316, 321 to 326, 331 to 336, and 341 to 346 are removed. Subsequently, the band-shaped Si pillar bases 12a, 12c, 12e, and 12g and the i-layers 40aa to 40ac (only 40aa is illustrated), 40ba to 40bc, 40ca to 40cc (only 40ca is illustrated), and 40da to 40dc (only 40da is illustrated) are etched by RIE using the SiO$_2$ layers 211a to 216a, 221a to 226a, 231a to 236a, and 241a to 246a as etching masks, thereby forming the Si pillars Pa1 to Ph3. As a result, the left-half region in FIG. 2DA has the same structure as illustrated in FIGS. 1HA to 1HC, whereas in the right-half region in FIG. 2DA, Si pillars Pb1 to Pb3, Pd1 to Pd3, Pf1 to Pf3, and Ph1 to Ph3 are formed on Si pillar bases 41aa to 41ac (only 41aa is illustrated), 41ba to 41bc, 41ca to 41cc (only 41ca is illustrated), and 41da to 41dc (only 41da is illustrated) which have the same shape, in plan view, as Si$_3$N$_4$ layers 314 to 316, 324 to 326, 334 to 336, and 344 to 346. Subsequently, the same steps as illustrated in FIGS. 1IA to 1MC are performed to form SGTs at the Si pillars Pb1 to Pb3, Pd1 to Pd3, Pf1 to Pf3, and Ph1 to Ph3.

The second embodiment of the present invention has the following features. In the first embodiment, two or more Si pillars (the Si pillars Pa1 to Ph3 in FIGS. 1HA to 1HC in the case of three Si pillars) aligned in the first or second direction in plan view are formed on corresponding Si pillar bases (the band-shaped Si pillar bases 12aa to 12da in FIGS. 1HA to 1HC in the case of three Si pillars). In the second embodiment, the Si pillars Pb1 to Pb3, Pd1 to Pd3, Pf1 to Pf3, and Ph1 to Ph3 are formed on the Si pillar bases 41aa to 41ac, 41ba to 41bc, 41ca to 41cc, and 41da to 41dc on the same SGT circuit board, the Si pillar bases having the same shape as the Si$_3$N$_4$ layers 311 to 316, 321 to 326, 331 to 336, and 341 to 346 in plan view. This enables one or more Si pillars to be formed on Si pillar bases depending on the circuit design. This leads to a circuit with higher density and higher performance.

Third Embodiment

A method for producing a pillar-shaped semiconductor device according to a third embodiment of the present invention will now be described with reference to FIGS. 3AA to 3CC.

FIGS. 3AA to 3AC illustrate a plan view and sectional views corresponding to FIGS. 1BA to 1BC. FIG. 3AA is a plan view, FIG. 3AB is a sectional view taken along line X2-X2' in FIG. 3AA, and FIG. 3AC is a sectional view taken along line Y-Y' in FIG. 3AA. The previous steps are the same as in the first embodiment. A SiO$_2$ layer (not illustrated), a Si$_3$N$_4$ layer (not illustrated), and a SiO$_2$ layer (not illustrated) are formed in this order from bottom to top on the i-layer 1a. Subsequently, the SiO$_2$ layers 2a to 2f, the Si$_3$N$_4$ layers 3a to 3f, and the SiO$_2$ layers 4a to 4f which, in plan view, extend in the first direction (Y-Y' direction) and are aligned in the second direction (X-X' direction) are formed by lithography and RIE as in the first embodiment. However, at a portion that will be overlapped by the resist layer 8b formed later (a portion where line X2-X2' and line Y-Y' intersect with each other in FIG. 3AA), the i-layer 1a is left exposed without stacking the SiO$_2$ layer 2c, the Si$_3$N$_4$ layer 3c, and the SiO$_2$ layer 4c. Hereinafter, portions of the SiO$_2$ layer 2c, the Si$_3$N$_4$ layer 3c, and the SiO$_2$ layer 4c that are overlapped by the resist layer 8a are referred to as a SiO$_2$ layer 2ca, a Si$_3$N$_4$ layer 3ca, and a SiO$_2$ layer 4ca, and portions that are overlapped by the resist layers 8c and 8d are referred to as a SiO$_2$ layer 2cb, a Si$_3$N$_4$ layer 3cb, and a SiO$_2$ layer 4cb. Subsequently, a carbon (C) layer (not illustrated) and a SiO$_2$ layer (not illustrated) are stacked in this order over the entire surface. Subsequently, the above-mentioned SiO$_2$ layer and carbon (C) layer are etched by RIE using the band-shaped resist layers 8a to 8d which, in plan view, extend in the second direction and are aligned in the first direction as masks as in the first embodiment, thereby forming the C layers 6a to 6d and the SiO$_2$ layers 7a to 7d under the resist layers 8a to 8d.

Figure 3B:
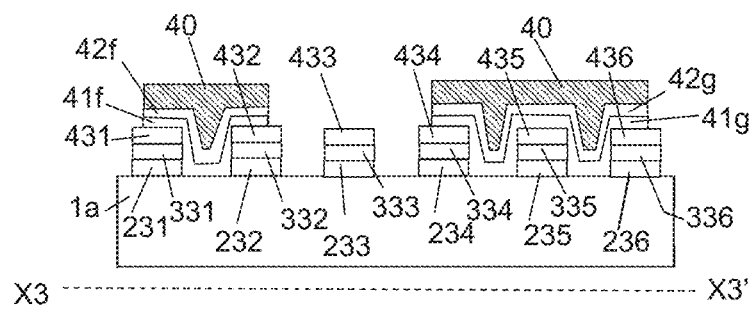
FIGS. 3BA to 3BF are a plan view and sectional views for explaining the method for producing a semiconductor device including SGTs according to the third embodiment.
Figure 3B:
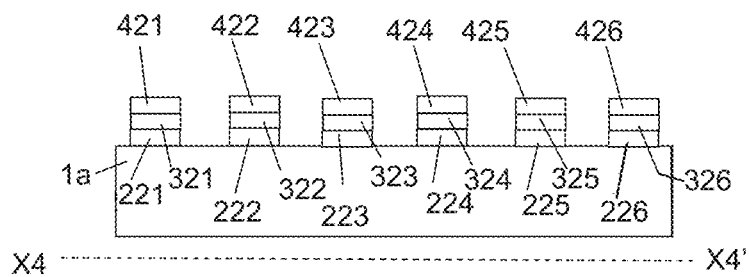
Figure 3C:
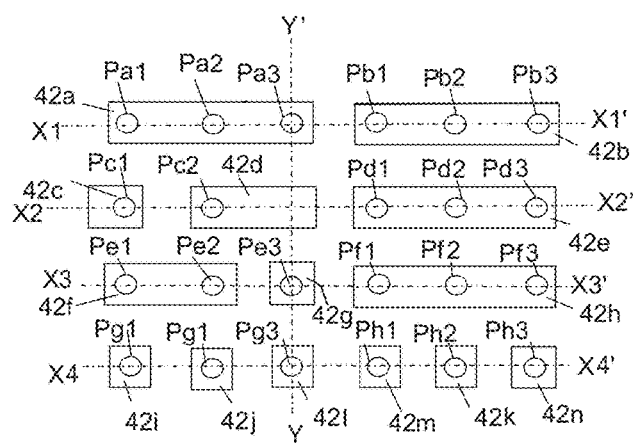
FIGS. 3CA to 3CC are a plan view and sectional views for explaining the method for producing a semiconductor device including SGTs according to the third embodiment.
Figure 3C:
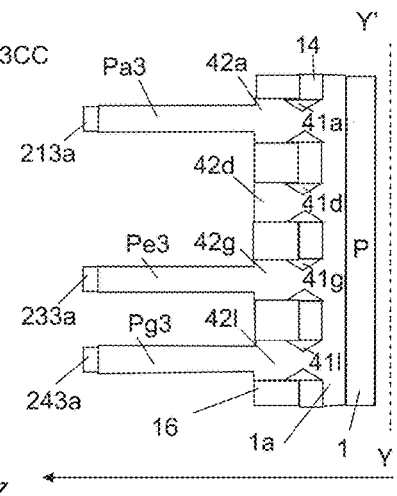
Figure 3C:
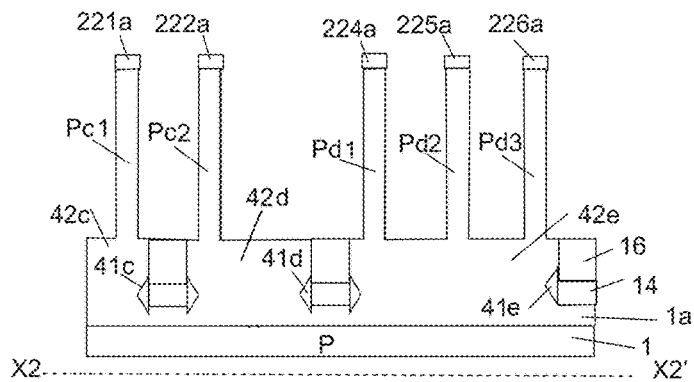
Figure 6:
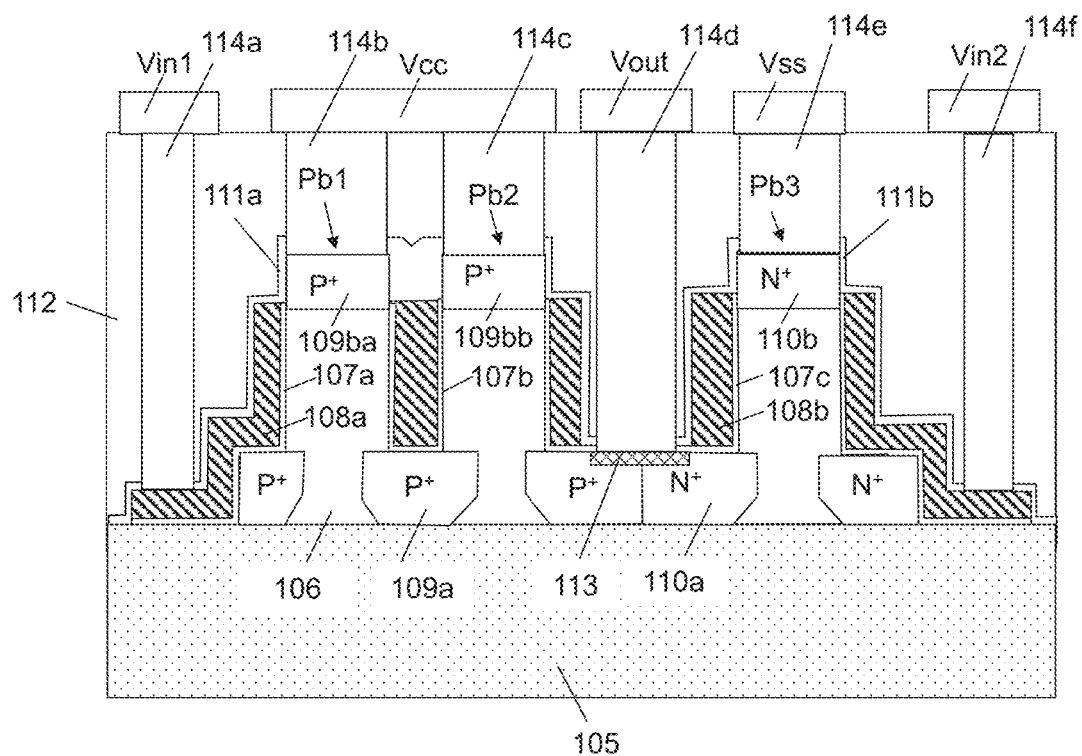
FIG. 6 illustrates an arrangement of Si pillars of a known CMOS inverter circuit including SGTs.
Figure 7A:
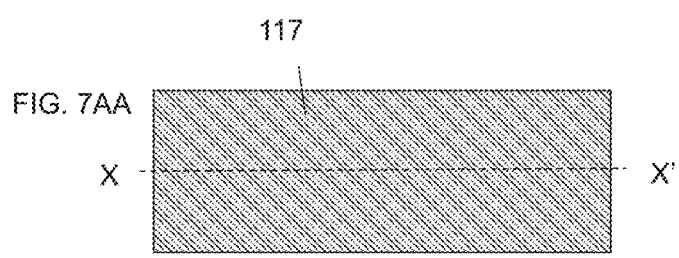
FIGS. 7AA and 7AB are a plan view and a sectional view for explaining a method for producing a known CMOS inverter circuit including SGTs.
Figure 7A:
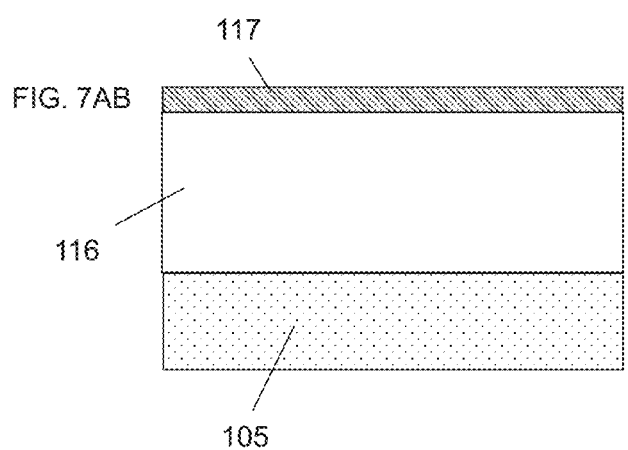
Figure 7B:
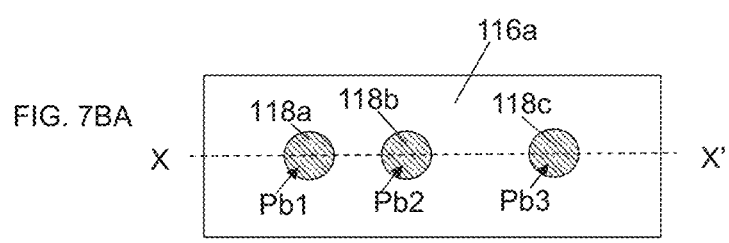
FIGS. 7BA and 7BB are a plan view and a sectional view for explaining the method for producing a known CMOS inverter circuit including SGTs.
Figure 7B:
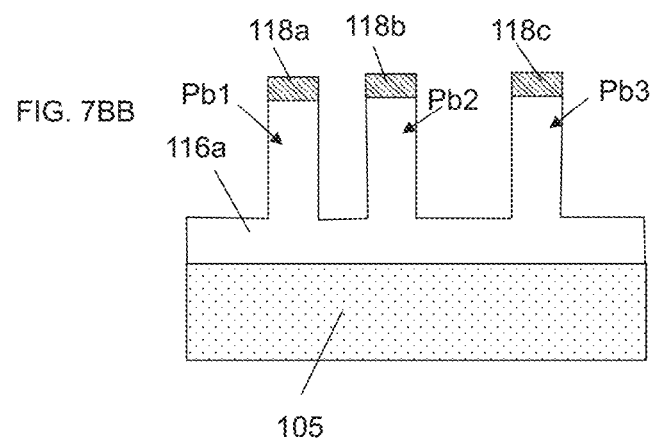
Figure 7C:
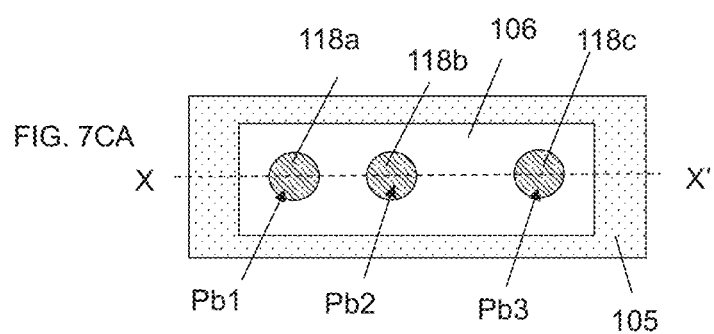
FIGS. 7CA and 7CB are a plan view and a sectional view for explaining the method for producing a known CMOS inverter circuit including SGTs.
Figure 7C:
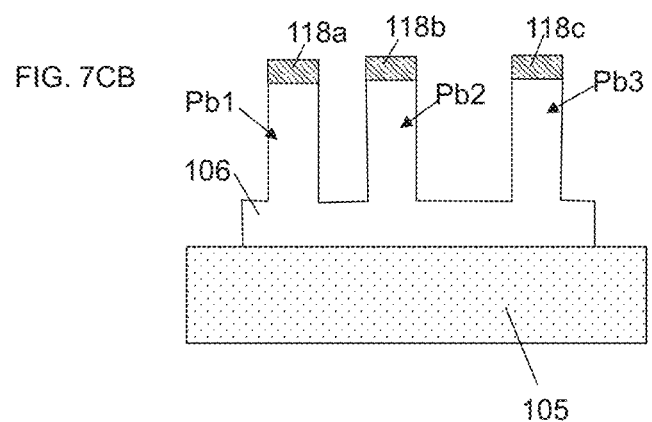

Next, FIGS. 3BA to 3BF illustrate a plan view and sectional views corresponding to FIGS. 1DA to 1DC. FIG. 3BA is a plan view, FIG. 3BB is a sectional view taken along line X1-X1' in FIG. 3BA, FIG. 3BC is a sectional view taken along line X2-X2' in FIG. 3BA, FIG. 3BD is a sectional view taken along line X3-X3' in FIG. 3BA, FIG. 3BE is a sectional view taken along line X4-X4' in FIG. 3BA, and FIG. 3BF is a sectional view taken along line Y-Y' in FIG. 3BA.

As illustrated in FIG. 3BA, resist layer windows W1 to W10 are opened in a resist layer 40 by lithography. Subsequently, the SiO$_2$ layers 7a to 7d and the C layers 6a to 6d are etched by RIE through the resist layer windows W1 to W10.

As illustrated in FIGS. 3BA and 3BB, along line X1-X1', the right end of the resist layer window W1 is located on the SiO$_2$ layer 411. The left end of the resist layer window W2 is located on the SiO$_2$ layer 413, and the right end is located on the SiO$_2$ layer 414. The left end of the resist layer window W3 is located on the SiO$_2$ layer 416. This portion has the same structure as in the first embodiment.

As illustrated in FIGS. 3BA and 3BC, along line X2-X2', the left end of the resist layer window W4 is located on the SiO2 layer 421, and the right end is located on the SiO2 layer 422. The right end of the resist layer window W5 is located on the SiO₂ layer 424, and the left end is located directly on the i-layer 1a. The left end of the resist layer window W6 is located on the SiO2 layer 426.

As illustrated in FIGS. 3BA and 3BD, along line X3-X3', the right end of the resist layer window W7 is located on the SiO₂ layer 431. The left end of the resist layer window W8 is located on the SiO₂ layer 432, and the right end is located on the SiO₂ layer 434. The left end of the resist layer window W9 is located on the SiO₂ layer 436.

As illustrated in FIGS. 3BA and 3BE, along line X4-X4', the resist layer window W10 is provided on the SiO2 layers 441 to 446 (i.e., these SiO2 layers have no resist layers thereon), the SiO2 layer 7d and the C layer 6d are etched away. This portion has the same structure as the left-half region in FIG. 2AA in the second embodiment.

Subsequently, the steps illustrated in FIGS. 1EA to 1HC are performed to form the Si pillars Pa1 to Ph3 (excluding Pc3) on Si pillar bases 42a to 42n. Subsequently, the P⁺ layer 14 is formed on a surface of the i-layer 1a at outer peripheries of the Si pillar bases 42a to 42n, N layers 41a to 41n (only 41a, 41d, 41e, 41g, and 41l are illustrated) are formed inwardly from the sides of the Si pillar bases 42a to 42n, and the SiO₂ layer 16 is formed so as to surround the Si pillar bases 42a to 42h.

Along line X1-X1', the Si pillars Pa1 to Pa3 and the Si pillars Pb1 to Pb3 are formed on the Si pillar bases 42a and 42b, respectively, as in the first embodiment. This results in the formation of the same SGT circuit as in the first embodiment.

Along line X2-X2', the Si pillar Pc1, the Si pillar Pc2, and the Si pillars Pd1 to Pd3 are formed on the Si pillar bases 42c, 42d, and 42e, respectively. On the Si pillar base 42d, the Si pillar Pc3, which is formed in the first embodiment, is not formed.

Along line X3-X3', the Si pillars Pe1 and Pe2, the Si pillar Pe3, and the Si pillars Pf1 to Pf3 are formed on the Si pillar bases 42f, 42g, and 42h, respectively. The Si pillars Pe1, Pe2, and Pf1 to Pf3 form the same SGT circuit as in the first embodiment. The Si pillar Pe3 forms the same SGT circuit as in the second embodiment.

Along line X4-X4', the Si pillars Pg1 to Ph3 are formed on the Si pillar bases 42i to 42n, respectively. This results in the formation of the same SGT circuit as in the second embodiment.

The third embodiment of the present invention provides the following effects.

1. In the first embodiment, as illustrated in FIGS. 1DA to 1DC, the resist layers 10a and 10b, which determine the positional relationship between the Si pillars Pa1 to Ph3 and the Si pillar bases 12aa to 12ha and the shapes thereof, are formed so as to extend in bands in the first direction in plan view. By contrast, in the third embodiment, as illustrated in FIGS. 3BA to 3BF, the resist layer 40, which has the resist layer windows W1 to W10, is formed in place of the resist layers 10a and 10b. Also by using the resist layer windows W1 to W10, excluding the resist layer window W5, the same effects as in the first or second embodiment are provided regarding the positional relationship between the Si pillars Pa1 to Ph3 (excluding Pc2) and the Si pillar bases 42a to 42n (excluding 42d) and the shapes thereof. According to the third embodiment, a circuit in which the positional relationship between the Si pillars Pa1 to Ph3 and the Si pillar bases 42a to 42n in the second direction differ from row to row can be formed depending on the circuit design. As in the first embodiment, Si pillars and Si pillar bases can be formed with their positional relationship rotated by 90° depending on the region, and thus a high-density and high-performance SGT circuit can be formed by using this feature.

2. In the region of the resist layer window W5, the absence of the SiO2 layer 2c, the Si₃N₄ layer 3c, and the SiO2 layer 4c enables a structure in which the Si pillar base 42d extends from below the Si pillar Pc2 to the right in plan view. Depending on the circuit design, for example, a contact hole may be formed on the extended Si pillar base 42d so as to connect the Si pillar base 42d with upper metal wiring through the contact hole. Such an extension of a Si pillar base due to the absence of a Si pillar can be achieved in the horizontal or vertical direction (in this case, the formation of Si pillars and Si pillar bases is rotated by) 90° by forming, depending on the circuit design, a structure similar to the structure illustrated in FIGS. 3AA to 3AC in which the SiO2 layer 2c, the Si3N4 layer 3c, and the SiO2 layer 4c are separated to form the SiO2 layers 2ca and 2cb, the Si3N4 layers 3ca and 3cb, and the SiO2 layers 4ca and 4cb. A high-density and high-performance SGT circuit can be formed by using this feature.

3. The resist layer window W8, in plan view, is formed so as to cover the whole SiO2 layer 433 and such that its left end is located on the SiO2 layer 432 and its right end is located on the SiO2 layer 434. Due to this configuration, the Si pillar Pe3 is formed on the Si pillar base 42g having a minimum area between the band-shaped Si pillar bases 42f and 42h. By using this feature, a Si pillar standing on a Si pillar base having a minimum area can be formed anywhere depending on the circuit design.

Fourth Embodiment

A method for producing a pillar-shaped semiconductor device according to a fourth embodiment of the present invention will now be described with reference to FIGS. 4AA to 4DC. Figures with reference characters that end with the letter A are plan views, figures with reference characters that end with the letter B are sectional views taken along lines X-X' in the figures with reference characters that end with the letter A, and figures with reference characters that end with the letter C are sectional views taken along line Y-Y' in the figures with reference characters that end with the letter A.

First, as illustrated in FIGS. 4AA to 4AC, the i-layer 1a is formed on the P layer substrate 1. Subsequently, a SiO₂ layer 45, a Si₃N₄ layer 46, a SiO₂ layer (not illustrated), a silicon nitride (Si₃N₄) layer (not illustrated), and a SiO₂ layer (not illustrated) are formed in this order from bottom to top on the i-layer 1a. Subsequently, the band-shaped resist layers 5a to 5f which, in plan view, extend in the first direction (Y-Y' direction) and are aligned in the second direction (X-X' direction) perpendicular to the first direction are stacked, and using these layers as etching masks, the above-mentioned SiO₂ layer, Si₃N₄ layer, and SiO₂ layer formed on the Si₃N₄ layer 46 are etched by reactive ion etching (RIE) to form, in the following order from bottom to top, the SiO₂ layers 2a to 2f, the Si₃N₄ layers 3a to 3f, and the SiO₂ layers 4a to 4f under the resist layers 5a to 5f, respectively. This provides a structure illustrated in FIGS. 4AA to 4AC that is the same as the structure illustrated in FIGS. 1AA to 1AC except that the SiO₂ layer 45 and the Si₃N₄ layer 46 are present between the i-layer 1a and the SiO₂ layers 4a to 4f. The resist layers 5a to 5f are then removed.

Next, the same steps as illustrated in FIGS. 1BA to 1GC are performed. As a result, as illustrated in FIGS. 4BA to 4BC, SiO₂ layers 45a to 45h are formed on the band-shaped Si pillar bases 12a to 12h, and Si$_3$N$_4$ layers 46a to 46h are formed on the SiO$_2$ layers 45a to 45h. The SiO$_2$ layers 211 to 216, 221 to 226, 231 to 236, and 241 to 246 (see FIGS. 1GA to 1GC) are isotropically etched from their side surfaces, for example, by plasma etching using the Si$_3$N$_4$ layers 311 to 316, 321 to 326, 331 to 336, and 341 to 346 as masks, thereby forming the SiO$_2$ layers 211a to 216a, 221a to 226a, 231a to 236a, and 241a to 246a which are circular in plan view. Since the SiO$_2$ layers 211a to 216a, 221a to 226a, 231a to 236a, and 241a to 246a are formed by isotropic etching from their side surfaces, their enlarged sections have a trapezoidal shape with a long lower side and a short upper side.

Next, as illustrated in FIGS. 4CA to 4CC, the Si$_3$N$_4$ layers 311 to 316, 321 to 326, 331 to 336, and 341 to 346 at the top are removed, for example, by RIE. Subsequently, using the SiO$_2$ layers 211a to 216a, 221a to 226a, 231a to 236a, and 241a to 246a as masks, the Si$_3$N$_4$ layer 46 is etched by RIE using an etchant that etches Si$_3$N$_4$ layers, thereby forming Si$_3$N$_4$ layers 46aa to 46hc (only 46ac, 46ec, 46gc, and 46ca to 46dc are illustrated). The Si$_3$N$_4$ layers 46aa, 46ab, 46ac, 46ba, 46bb, and 46bc are formed under the SiO$_2$ layers 211a, 212a, 213a, 214a, 215a, and 216a, respectively. Likewise, the Si$_3$N$_4$ layers 46ca to 46hc are formed under the SiO$_2$ layers 221a to 226a, 231a to 236a, and 241a to 246a. Subsequently, using the Si$_3$N$_4$ layers 46aa to 46hc as masks, the SiO$_2$ layer 45 is etched by RIE using an etchant that etches the SiO$_2$ layer 45, thereby forming SiO$_2$ layers 45aa to 45hc (only 45ac, 45ec, 45gc, and 45ca to 45dc are illustrated) under the Si$_3$N$_4$ layers 46aa to 46hc, respectively. The Si$_3$N$_4$ layers 46aa to 46hc are formed by RIE etching, which is anisotropic etching, using the SiO$_2$ layers 211a to 216a, 221a to 226a, 231a to 236a, and 241a to 246a as masks, and thus have rectangular X-X' sections. The SiO$_2$ layers 45aa to 45hc also have rectangular X-X' sections.

Next, as illustrated in FIGS. 4DA to 4DC, the band-shaped Si pillar bases 12a to 12h are etched by RIE using the Si$_3$N$_4$ layers 46aa to 46hc and the SiO$_2$ layers 45aa to 45hc, each having a rectangular section, as masks such that band-shaped Si pillar bases 12aa to 12ha are left at the bottom, thereby forming the Si pillars Pa1 to Ph3. As a result, the Si pillars Pa1 to Ph3 are formed on the band-shaped Si pillar bases 12aa to 12ha as in FIGS. 1HA to 1HC. After this, the same steps as in FIGS. 1HA to 1MC are performed to form an SRAM cell circuit. The Si pillars Pa1 to Ph3 may be formed by etching the band-shaped Si pillar bases 12a to 12h by RIE with the SiO$_2$ layers 211a to 216a, 221a to 226a, 231a to 236a, and 241a to 246a left unremoved.

The fourth embodiment of the present invention provides the following effects.

In the first embodiment, the Si pillars Pa1 to Ph3 are formed by etching the band-shaped Si pillar bases 12a to 12h by RIE using the SiO$_2$ layers 211a to 216a, 221a to 226a, 231a to 236a, and 241a to 246a, whose enlarged sections are trapezoidal, as masks such that the band-shaped Si pillar bases 12aa to 12ha are left at the bottom. In the RIE etching of the band-shaped Si pillar bases 12a to 12h, the SiO$_2$ layers 211a to 216a, 221a to 226a, 231a to 236a, and 241a to 246a used as etching masks are etched from their upper surfaces, albeit slightly. As a result, the SiO$_2$ layers 211a to 216a, 221a to 226a, 231a to 236a, and 241a to 246a, which have a trapezoidal sectional shape, are gradually removed from their outer peripheries. Thus, the SiO$_2$ layers 211a to 216a, 221a to 226a, 231a to 236a, and 241a to 246a, which are circular in plan view, are gradually reduced in a concentrical manner. As a result, sections of the Si pillars Pa1 to Ph3 have a trapezoidal shape with a long lower side and a short upper side. This may cause a difference in electrical properties between SGTs in which positions of a source and a drain in the height direction are replaced with each other. This may lead to difficulty in designing a circuit including SGTs. This may also lead to a great variation among sectional shapes of the Si pillars Pa1 to Ph3 in plan view. By contrast, in the fourth embodiment, the Si pillars Pa1 to Ph3 are formed by RIE etching using the Si$_3$N$_4$ layers 46aa to 46hc, whose sections are rectangular, and the SiO$_2$ layers 45aa to 45hc, whose sections are rectangular, as masks (only the SiO$_2$ layers 45aa to 45hc may be used as masks). This enables the formed Si pillars Pa1 to Ph3 to have sectional shapes closer to rectangular, leading to the formation of Si pillars Pa1 to Ph3 that are highly accurate in plan view.

Although the above embodiments have been described in the context of SGTs including Si semiconductor pillars, the material of semiconductor pillars is not limited to Si, and the semiconductor pillars may be partially or wholly made of another material.

In the above embodiments, the P layer substrate 1 may be substituted with another semiconductor substrate having conductivity or an SOI substrate including an insulating substrate.

In the first embodiment, as illustrated in FIGS. 1DA to 1DC, the SiO$_2$ layers 211 to 246, the Si$_3$N$_4$ layers 311 to 346, and the SiO$_2$ layers 411 to 446 are formed. The SiO$_2$ layers 211 to 246 function as etching masks when the i-layer 1a is etched, as illustrated in FIGS. 1EA to 1EC. The Si$_3$N$_4$ layers 311 to 346 function as etching masks for forming the SiO$_2$ layers 211a to 246a by performing isotropic plasma etching on the SiO$_2$ layers 411 to 446, as illustrated in FIGS. 1GA to 1GC. The SiO$_2$ layers 211a to 246a function as etching masks for forming the Si pillars Pa1 to Ph3 by etching the i-layer 1a, as illustrated in FIGS. 1HA to 1HC. The SiO$_2$ layers 211 to 246, the Si$_3$N$_4$ layers 311 to 346, and the SiO$_2$ layers 411 to 446 may each be another material layer formed of one or more layers as long as the above functions can be achieved. The same applies to other embodiments.

In the first embodiment, the SiO2 layers 211 to 246 function as etching masks when the i-layer 1a is etched, as illustrated in FIGS. 1EA to 1EC. When the Si3N4 layers 311 to 346 are substituted with other material layers formed of one or more layers that function as etching masks for forming the SiO$_2$ layers 211a to 246a by performing isotropic plasma etching on the SiO$_2$ layers 411 to 446 and that also function as etching masks when the i-layer 1a is etched, the Si3N4 layers 311 to 346 may be omitted. The same applies to other embodiments.

In the first embodiment, as illustrated in FIGS. 1DA to 1DC, the SiO2 layers 7aa, 7bc, 7ce, 7dg, 1ab (not illustrated), 7bd, 7cf (not illustrated), and 7dh (not illustrated) and the C layers 6aa, 6bc, 6ce, 6dg, 6ab (not illustrated), 6bd, 6cf (not illustrated), and 6dh (not illustrated) are formed. The SiO$_2$ layers 7aa to 7dh function as etching masks for forming the C layers 6aa to 6dh and function as etching masks when the i-layer 1a is etched. The C layers 6aa to 6dh function as etching stopper layers for protecting the underlying SiO$_2$ layers 411 to 446 when the SiO$_2$ layers 7aa to 7dh are formed using the resist layers 10a and 10b as etching masks. In addition, the C layers 6aa to 6dh, when removed later, does not cause the surface of the i-layer 1a to be etched. The SiO$_2$ layers 7aa to 7dh and the C layers 6aa to 6dh may each be another material layer formed of one or more layers as long as the above functions can be achieved. Alternatively, another material layer formed of a single layer may be used as long as it has the functions of both the SiO$_2$ layers 7aa to 7dh and the C layers 6aa to 6dh. The same applies to other embodiments.

In the first embodiment, as illustrated in FIGS. 1AA to 1AC, the band-shaped resist layers 5a to 5f are stacked, and using these layers as etching masks, the above-mentioned SiO2 layer, Si3N4 layer, and SiO2 layer are etched by reactive ion etching (RIE) to form, in the following order from bottom to top, the SiO2 layers 2a to 2f, the Si3N4 layers 3a to 3f, and the SiO2 layers 4a to 4f under the resist layers 5a to 5f, respectively. In this case, in the lithographic process for forming the band-shaped resist layers 5a to 5f, resist-baking temperature, time, developing conditions, and other conditions may be adjusted to reduce the width of the band-shaped resist layers 5a to 5f. This shortens the time taken to isotropically etch the SiO2 layers 211 to 216, 221 to 226, 231 to 236, and 241 to 246 from their side surfaces, enabling the SiO2 layers 211a to 216a, 221a to 226a, 231a to 236a, and 241a to 246a having a predetermined circular shape to be readily formed. Alternatively, the width may be reduced by forming inorganic or organic layers formed of one or more layers under the band-shaped resist layers 5a to 5f and etching the inorganic or organic layers from their side surfaces. The same applies to the formation of the band-shaped resist layers 8a to 8d illustrated in FIGS. 1BA to 1BC. The same applies to other embodiments.

The band-shaped resist layers 5a to 5f and 8a to 8d in the first embodiment may each be constituted by an organic material layer and an inorganic material layer, each being formed of one or more layers. The same applies to other embodiments.

The C layers 6a to 6d illustrated in FIGS. 1BA to 1BC in the first embodiment may be planarized, for example, by CMP such that upper surfaces of the C layers 6a to 6d are located above upper surfaces of the SiO$_2$ layers 4a to 4f. This planarization may be performed when the SiO$_2$ layers 7a to 7d are formed. This facilitates the formation of the resist layers 8a to 8d. Alternatively, the resist layers 8a to 8d may be formed after one or more material layers having planar upper surfaces are formed. This planarization is performed, for example, in a manner that one or more material layers are formed by flowable chemical vapor deposition (FCVD) and then planarized by CMP such that the top of the layers is flush with the top of the SiO$_2$ layer (not illustrated). Thereafter, the band-shaped resist layers 8a to 8d may be formed on the planarized surface. The same applies to other embodiments.

In the first embodiment, as illustrated in FIGS. 1AA to 1AC, the band-shaped resist layers 5a to 5f are stacked, and using these layers as etching masks, the above-mentioned SiO2 layer, Si3N4 layer, and SiO2 layer are etched by reactive ion etching (RIE) to form, in the following order from bottom to top, the SiO2 layers 2a to 2f, the Si3N4 layers 3a to 3f, and the SiO2 layers 4a to 4f under the resist layers 5a to 5f, respectively. Alternatively, the SiO2 layers 2a to 2f, the Si3N4 layers 3a to 3f, and the SiO2 layers 4a to 4f may be formed by providing a material layer between the band-shaped resist layers 5a to 5f and the topmost SiO$_2$ layer, etching the material layer using the band-shaped resist layers 5a to 5f as masks, and then performing, for example, RIE etching using the material layer as a mask. Another material layer formed of one or more layers may be used as long as it is a mask material layer that allows the SiO$_2$ layers 2a to 2f, the Si$_3$N$_4$ layers 3a to 3f, and the SiO$_2$ layers 4a to 4f to be formed into a predetermined shape. The underlying material layer may be isotropically etched using the band-shaped resist layers 5a to 5f as masks to produce the same effect as obtained by reducing the width of the band-shaped resist layers 5a to 5f. The same applies to the formation of the band-shaped resist layers 8a to 8d illustrated in FIGS. 1BA to 1BC. The same applies to other embodiments.

After the step illustrated in FIGS. 1FA to 1FC in the first embodiment, a thin SiN layer is formed over the entire surface, for example, by ALD. Subsequently, a SiO2 film is formed over the entire surface by a spin process or CVD, and then the SiO2 layer 16 is formed in a groove in outer peripheries of the band-shaped Si pillar bases by CMP and an etch-back process. Subsequently, the formation of the Si pillars Pa1 to Ph3 illustrated in FIGS. 1HA to 1HC is performed with the SiO2 layer left unremoved. This enables the SiO2 layer in the groove in the outer peripheries of the band-shaped Si pillar bases to prevent thin Si pillars Pa1 to Ph3 from toppling, for example, during a washing step. This suggests that thinner Si pillars Pa1 to Ph3 can be formed. Such a step for facilitating the production of a high-density SGT circuit can be added. The same applies to other embodiments.

In the first embodiment, the SiO2 layers 221a to 246a which are circular in plan view are formed by isotropic plasma etching using the Si3N4 layers 311 to 346 as etching masks. However, any etching method other than plasma etching may be used as long as the SiO$_2$ layers 221 to 246 are isotropically etched inwardly from outer peripheries of the Si$_3$N$_4$ layers 311 to 346. Alternatively, the SiO$_2$ layers 221 to 246 may be substituted with other material layers, and etching mask layers that are circular in plan view may be formed by oxidizing side surfaces of the material layers and removing the oxidized layers thus formed. The same applies to other embodiments.

In the first to third embodiments, the band-shaped SiO2 layers 211 to 246, Si3N4 layers 311 to 346, and SiO$_2$ layers 411 to 446 extending in the first or second direction are formed, and then the band-shaped C layers 6a to 6d and SiO$_2$ layers 7a to 7d perpendicular to the band-shaped SiO2 layers 211 to 246, Si3N4 layers 311 to 346, and SiO2 layers 411 to 446 are formed. The difference among the three embodiments is the shape of the band-shaped C layers 6a to 6d and SiO$_2$ layers 7a to 7d in plan view after being etched, as illustrated in FIGS. 1DA to 1DC, FIGS. 2AA to 2AC, and FIGS. 3BA to 3BF. The shape of the band-shaped C layers 6a to 6d and SiO$_2$ layers 7a to 7d after being etched depends on the shape of the resist layers 10a and 10b and the resist layer 40 having the resist layer windows W1 to W10, the resist layers being formed by lithography. This enables a circuit having one, two, or all configurations of the first to third embodiments to be formed on one substrate. The same applies to other embodiments.

In the description of the first embodiment, the Si pillars Pa1 to Ph3 which are circular in plan view are formed with the band-shaped resist layers 5a to 5f and the band-shaped resist layers 8a to 8d having the same width. However, the length in the X direction and the length in the Y direction of Pa1 to Ph3 can easily be changed by changing the width of the band-shaped resist layers 5a to 5f and the band-shaped resist layers 8a to 8d. Depending on the circuit region, a circuit including Si pillars whose lengths in the X direction and the Y direction are different can be formed. The same applies to other embodiments.

In the third embodiment, the resist layer windows W2, W5, W8, and W10 have been described as having independent rectangular shapes. However, forming a rectangular resist layer window having such a shape that the resist layer windows W2 and W5 are communicated with each other in the first direction will never decreases processing accuracy of the Si pillars Pa1 to Ph3 and the Si pillar bases 42a to 42n.

Likewise, forming an L-shaped resist layer window having such a shape that the resist layer windows W5 and W8 are communicated with each other can produce the same effect. Forming a T-shaped resist layer window having such a shape that the resist layer windows W8 and W10 are communicated with each other can also produce the same effect. The shape of the windows other than the resist layer windows W2, W5, W8, and W10 can also be changed. Thus, various circuits can readily be formed by changing the shape of resist layer windows. The resist layer 40 may be another material layer formed of one or more layers as long as the object can be achieved. The same applies to other embodiments.

In the first to fourth embodiments, before the band-shaped C layers 6a to 6d and SiO2 layers 7a to 7d are formed, a thin etching mask layer may be formed over the entire surface of a structure formed after the SiO2 layers 211 to 246, the Si$_3$N$_4$ layers 311 to 346, and the SiO2 layers 411 to 446 are formed. This can protect the i-layer 1a from the etching in the subsequent step.

In the above embodiments, any material can be selected and used for etching mask material layers and etching target material layers etched using the etching mask material layers as long as the above requirements are satisfied. Likewise, any etching method such as RIE and isotropic plasma etching can be selected and used as long as the above requirements are satisfied.

In the first embodiment, the HfO2 layer 24 is used as a gate insulating layer, and the TiN layers 25a, 25b, 25c, and 25d are used as gate conductor layers, but another material layer formed of one or more layers may be used. The N$^+$ regions 20aa, 20ba, 20ca, 20da, 26a, 26c, 26d, and 26f and the P$^+$ regions 21aa, 21bb, 26b, and 26e are formed as source impurity and drain impurity regions by ion implantation. Alternatively, N$^+$ regions and P$^+$ regions may be formed, for example, by forming crystalline monolayer impurity regions on side surfaces of the Si pillars Pa1 to Ph3. Alternatively, layers corresponding to the P$^+$ region 14a, the N regions 13ca and 13ea, the N$^+$ regions 20aa, 20ba, 20ca, and 20da, and the P$^+$ regions 21aa and 21ba may be formed in advance on the P layer substrate 1 illustrated in FIGS. 1AA to 1AC and in the i-layer 1a by epitaxial crystal growth and ion implantation. Another method may be used. The same applies to other embodiments.

In the first embodiment, conductor layers such as metal layers or silicide layers may be provided on or in the N+ regions 20aa, 20ba, 20ca, 20da, 26a, 26c, 26d, and 26f and the P+ regions 21aa, 21bb, 26b, and 26e on outer peripheries of the Si pillars Pa1 to Ph3. The same applies to other embodiments.

In the fourth embodiment, the Si3N4 layers 46aa to 46hc and the SiO$_2$ layers 45aa to 45hc which are rectangular in X-X' section are provided between the SiO$_2$ layers 211a to 216a, 221a to 226a, 231a to 236a, and 241a to 246a and the band-shaped Si pillar bases 12a to 12h. The Si$_3$N$_4$ layers 46aa to 46hc and the SiO$_2$ layers 45aa to 45hc are used as etching masks for forming the Si pillars Pa1 to Ph3 without depending on the SiO$_2$ layers 211a to 216a, 221a to 226a, 231a to 236a, and 241a to 246a. The Si$_3$N$_4$ layers 46aa to 46hc and the SiO$_2$ layers 45aa to 45hc may be material layers made of other materials as long as they are formed to be rectangular in X-X' section using the SiO$_2$ layers 211a to 216a, 221a to 226a, 231a to 236a, and 241a to 246a as masks and can form the Si pillars Pa1 to Ph3 by etching the band-shaped Si pillar bases 12a to 12h. The Si$_3$N$_4$ layers 46aa to 46hc and the SiO$_2$ layers 45aa to 45hc may be other material layers formed of one or more layers as long as the same effect can be produced. The same applies to other embodiments.

In the fourth embodiment, the SiO2 layers 211a to 216a, 221a to 226a, 231a to 236a, and 241a to 246a determine the shape of the Si pillars Pa1 to Ph3 in plan view as in other embodiments. Therefore, the fourth embodiment can be applied to other embodiments.

The methods for producing a circuit including SGTs according to the above embodiments can be used for forming not only a CMOS-type SRAM circuit but also other circuits including SGTs.

Although the above embodiments have been described in the context of forming one SGT for each of the Si pillars Pa1 to Ph3, two or more SGTs may be formed for one Si pillar.

An SGT has a structure in which a gate insulating film is formed around a semiconductor pillar and a gate conductor layer is formed around the gate insulating film. A flash memory device including a conductor layer electrically floating between a gate conductor layer and a gate insulating layer is also a type of SGT, and thus the technical idea of the present invention can be applied to such a flash memory device.

Although the above embodiments have been described in the context of forming an SGT at one semiconductor pillar, the technical idea of the present invention is also applicable to a method for producing a semiconductor device including SGTs and other elements (e.g., photodiodes).

The above embodiments have been described in the context where the first and second directions are perpendicular to each other. However, some deviations in angle between the first and second directions that occur during mask alignment in a lithographic process are acceptable. The first and second directions need not be perpendicular to each other if regions where the SiO2 layers 2a to 2f, the Si3N4 layers 3a to 3f, and the SiO2 layers 4a to 4f which extend in the first direction and the band-shaped resist layers 8a to 8d which extend in the second direction overlap each other have such a size that allows mask layers for Si pillar formation to be carved out by isotropic etching.

Various other embodiments and modifications are possible without departing from the broad spirit and scope of the present invention. The embodiments described above are merely illustrative of the present invention and are not intended to be restrictive of the scope of the present invention. The above-described embodiments and modifications thereof may be freely combined. Some of the constituent features of the present invention may optionally be omitted, and such embodiments are still within the scope of the present invention.

The present invention provides a higher-density semiconductor device including SGTs.

What is claimed is:

1. A method for producing a pillar-shaped semiconductor device, the method comprising:
   a step of forming, on a semiconductor layer, a band-shaped first material layer that extends in a first direction in plan view;
   a step of forming, on the band-shaped first material layer, a band-shaped second material layer that extends in a second direction different from the first direction in plan view;
   a step of forming an overlapping-portion first material layer at a portion where the band-shaped first material layer overlaps the band-shaped second material layer in plan view by etching the band-shaped first material layer using the band-shaped second material layer as a mask;

a step of forming, on the band-shaped second material layer, a third material layer whose one or both ends are located, in plan view, on two opposite overlapping-portion first material layers among a plurality of the overlapping-portion first material layers aligned in the second direction;

a step of forming a fourth material layer by etching the band-shaped second material layer using the third material layer as a mask;

a step of forming a first semiconductor pillar base by etching the semiconductor layer using the overlapping-portion first material layer and the fourth material layer as etching masks;

a step of removing the fourth material layer; and a step of forming a semiconductor pillar by etching the first semiconductor pillar base using the overlapping-portion first material layer as an etching mask, wherein a first pillar-shaped semiconductor device including the semiconductor pillar as a channel is formed.

2. The method for producing a pillar-shaped semiconductor device according to claim 1, wherein the overlapping-portion first material layer includes an upper first material layer and a lower first material layer, each being formed of one or more layers, the method further comprises a step of forming a reduced lower first material layer by laterally etching the lower first material layer using the upper first material layer as an etching mask, and the semiconductor pillar is formed by etching the semiconductor layer using the reduced lower first material layer as a mask.

3. The method for producing a pillar-shaped semiconductor device according to claim 1, wherein the step of forming the fourth material layer is performed so as to leave a region where the fourth material layer is not formed on the overlapping-portion first material layer.

4. The method for producing a pillar-shaped semiconductor device according to claim 1, wherein a portion of the band-shaped first material layer is removed to form a region where the overlapping-portion first material layer does not exist.

5. The method for producing a pillar-shaped semiconductor device according to claim 1, wherein the band-shaped first material layer and the band-shaped second material layer have different widths in plan view.

6. The method for producing a pillar-shaped semiconductor device according to claim 1, wherein in the step of forming the band-shaped first material layer, a band-shaped fifth material layer having a width different from a width of the band-shaped first material layer in plan view is formed in a region that is on the semiconductor layer and separate from a region where the first pillar-shaped semiconductor device is to be formed.

7. The method for producing a pillar-shaped semiconductor device according to claim 1, wherein in the step of forming the band-shaped second material layer, a band-shaped sixth material layer having a width different from a width of the band-shaped second material layer in plan view is formed in a region that is on the semiconductor layer and separate from a region where the first pillar-shaped semiconductor device is to be formed.

8. The method for producing a pillar-shaped semiconductor device according to claim 1, wherein in the step of forming the band-shaped first material layer, a band-shaped seventh material layer that extends in the second direction is formed, and in the step of forming the band-shaped second material layer, a band-shaped eighth material layer that extends in the first direction is formed, the band-shaped seventh material layer and the band-shaped eighth material layer each being formed in a region that is on the semiconductor layer and separate from a region where the first pillar-shaped semiconductor device is to be formed.

9. The method for producing a pillar-shaped semiconductor device according to claim 1, wherein in the step of forming the third material layer, a window where the third material layer does not exist in plan view is formed, and at least one end of the window is located on the overlapping-portion first material layer.

10. The method for producing a pillar-shaped semiconductor device according to claim 1, wherein in the step of forming the fourth material layer, a ninth material layer is formed in a region where the overlapping-portion first material layer does not exist, and the method further comprises a step of forming a second semiconductor pillar base by etching the semiconductor layer using the ninth material layer as a mask.

11. The method for producing a pillar-shaped semiconductor device according to claim 1, the method further comprising:

before the band-shaped first material layer is formed, a step of forming a tenth material layer formed of one or more layers on the semiconductor layer, wherein in the step of forming the first semiconductor pillar base, the first semiconductor pillar base is formed after the tenth material layer is etched using the overlapping-portion first material layer and the fourth material layer as etching masks, and the semiconductor pillar is formed after the tenth material layer is etched using the overlapping-portion first material layer as an etching mask.

12. The method for producing a pillar-shaped semiconductor device according to claim 11, wherein the tenth material layer under the overlapping-portion first material layer is used as an etching mask for forming the semiconductor pillar.

13. The method for producing a pillar-shaped semiconductor device according to claim 1, the method further comprising:

after the first semiconductor pillar base is formed, a step of forming an impurity region containing a donor or acceptor impurity on a surface of the semiconductor layer at an outer periphery of the first semiconductor pillar base in plan view;

and a step of forming a side impurity region by diffusing the donor or acceptor impurity laterally into the first semiconductor pillar base by heat treatment.

* * * * *